United States Patent
Sarayama et al.

(10) Patent No.: US 6,949,140 B2
(45) Date of Patent: Sep. 27, 2005

(54) CRYSTAL GROWTH METHOD, CRYSTAL GROWTH APPARATUS, GROUP-III NITRIDE CRYSTAL AND GROUP-III NITRIDE SEMICONDUCTOR DEVICE

(75) Inventors: Seiji Sarayama, Miyagi (JP); Hirokazu Iwata, Miyagi (JP); Masahiko Shimada, Miyagi (JP); Hisanori Yamane, Miyagi (JP); Masato Aoki, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 302 days.

(21) Appl. No.: 10/308,149

(22) Filed: Dec. 3, 2002

(65) Prior Publication Data

US 2003/0164138 A1 Sep. 4, 2003

(30) Foreign Application Priority Data

| Dec. 5, 2001 | (JP) | 2001-371147 |
| Jan. 10, 2002 | (JP) | 2002-003312 |
| Jan. 29, 2002 | (JP) | 2002-019986 |
| Apr. 22, 2002 | (JP) | 2002-119453 |

(51) Int. Cl.[7] ............................................. C30B 17/00
(52) U.S. Cl. .............................. 117/81; 117/82; 117/83; 117/954; 117/223
(58) Field of Search ........................... 117/223, 81, 82, 117/83, 904

(56) References Cited

U.S. PATENT DOCUMENTS

| 5,665,985 A | 9/1997 | Iwata |
| 5,684,523 A | 11/1997 | Satoh et al. |
| 6,780,239 B2 * | 8/2004 | Sarayama et al. ............. 117/36 |
| 2002/0046695 A1 | 4/2002 | Sarayama et al. |
| 2002/0175338 A1 | 11/2002 | Sarayama et al. |

FOREIGN PATENT DOCUMENTS

| JP | 10/256662 A | 9/1998 |
| JP | 11-004048 A | 1/1999 |
| JP | 2000/12900 A | 1/2000 |
| JP | 2000/22212 A | 1/2000 |
| JP | 2000/327495 | 11/2000 |
| JP | 2001/058900 A | 3/2001 |
| JP | 2001/102316 A | 4/2001 |
| WO | WO 95/04845 A1 | 1/1995 |

OTHER PUBLICATIONS

Yamane et al., Preparation of GaN Single Crystals a Na Flux, Chem. Mater, 1997, 9, pp. 413–416.
Nakamura et al., InGaN/GaN/AIGaN–Based Laser Diodes with Modulation–Doped Strained–Layer Supperlattices, Jpn. J.Appl. Phys. vol. 36 (1997) pp. L1568–L1571.
Nakamura et al., InGaN/GaN/AIGaN–Based Laser Diodes wit hCleaved Facets Grown on GaN Structures, Applied Physics Letters, vol. 73, Nov. 6, pp. 832–834.
Porowski, Bulk and Homoepitaxial GaN–Growth and CHaracterisation, J. Crys, Growth, 189/190 (1990) pp. 153–158.

* cited by examiner

*Primary Examiner*—Robert Kunemund
(74) *Attorney, Agent, or Firm*—Dickstein Shapiro Morin & Oshinsky LLP

(57) ABSTRACT

A group-III nitride crystal growth method, comprising the steps of: a) preparing a mixed molten liquid of an alkaline metal and a material at least comprising a group-III metal; b) growing a group-III nitride crystal of the group-III metal and nitrogen from the mixed molten liquid and a material at least comprising nitrogen; and c) setting a predetermined crystal growth condition according to a zone defined by a pressure and a temperature in said step b).

69 Claims, 20 Drawing Sheets

FIG.7
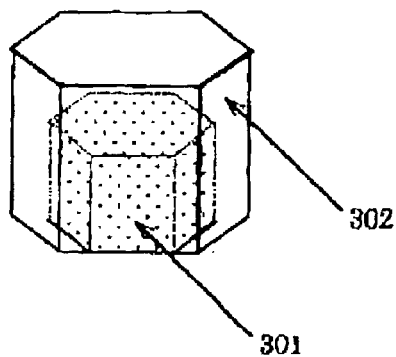
FIG.8A  FIG.8B
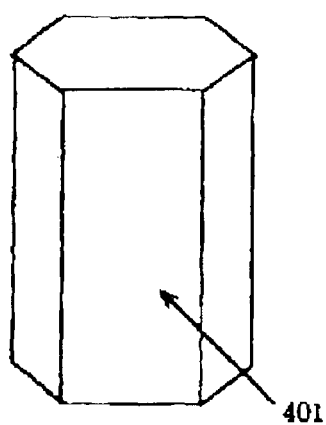 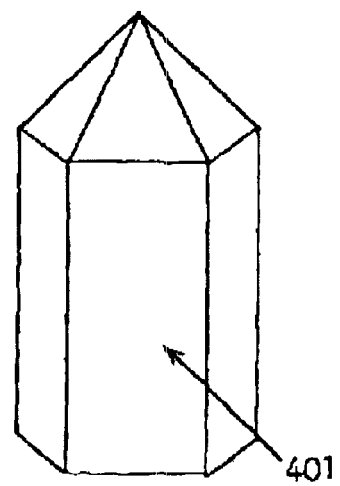
FIG.9
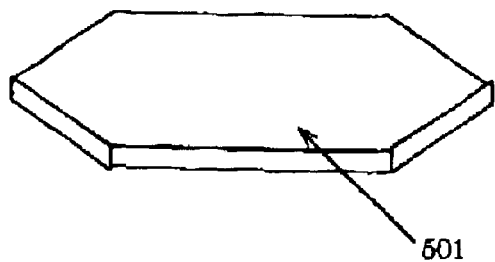

CRYSTAL GROWTH METHOD, CRYSTAL GROWTH APPARATUS, GROUP-III NITRIDE CRYSTAL AND GROUP-III NITRIDE SEMICONDUCTOR DEVICE

BACKGROUND OF THE INVENTION

1. Field of the Invention

The present invention relates to a crystal growth method, a crystal growth apparatus, a group-III nitride crystal, and a group-III nitride semiconductor device. In particular, the present invention relates to a crystal growth method and a crystal growth apparatus for a group-III nitride crystal, the group-III nitride crystal, and a group-III nitride semiconductor device employing the group-III nitride crystal applicable to a light source (LED, LD, or the like) for blue light for an optical disk drive, for example.

2. Description of the Related Art

Now, a InGaAlN-family (group-III nitride) device used as violet through blue through green light sources is produced by a crystal growth process employing an MO-CVD method (organic metal chemical vapor phase growth method), an MBE method (molecular beam crystal growth method), etc, on a sapphire or SiC substrate in most cases. In using sapphire or SiC as a substrate, crystal defect caused due to a large expansivity difference and/or lattice constant difference from a group-III nitride may occur frequently. By this reason, there is a problem that the device characteristic may become worth, it may be difficult to lengthen the life of the light-emission device, or the electric power consumption may become larger.

Furthermore, since a sapphire substrate has an insulating property, drawing of an electrode from the substrate like in another conventional light-emission device is impossible, and therefore, drawing the electrode from the nitride semiconductor surface on which crystal was grown is needed. Consequently, the device area may have to be enlarged, and, thereby, the costs may increase. Moreover, chip separation by cleavage is difficult for a group-III nitride semiconductor device produced on a sapphire substrate, and it is not easy to obtain a resonator end surface needed for a laser diode (LD) by cleavage, either. By this reason, a resonator end surface formation according to dry etching or, after grinding a sapphire substrate to the thickness of 100 micrometers or less, a resonator end surface formation in a way near cleavage should be performed. Also in such a case, it is impossible to perform formation of a resonator end surface and chip separation easily by a single process like for another conventional LD, and, also, complication in process, and, thereby, cost increase may occur.

In order to solve these problems, it has been proposed to reduce the crystal defects by employing a selective lateral growth method and/or another technique for forming a group-III nitride semiconductor film on a sapphire substrate.

For example, a document 'Japanese Journal of Applied Physics, Vol. 36 (1967), Part 2, No. 12A, pages L1568–1571' (referred to as a first prior art, hereinafter) discloses a laser diode (LD) shown in FIG. 1. This configuration is produced as follows: After growing up a GaN low-temperature buffer layer 2 and a GaN layer 3, one by one, on a sapphire substrate 1 by an MO-VPE (organometallic vapor phase epitaxy) apparatus, a $SiO_2$ mask 4 for selective growth is formed. This $SiO_2$ mask 4 is formed through photo lithography and etching process, after depositing a $SiO_2$ film by another CVD (chemistry vapor phase deposition) apparatus. Next, on this $SiO_2$ mask 4, again, a GaN film 3' is grown up to a thickness of 20 micrometers by the MO-VPE apparatus, and, thereby, GaN grows laterally selectively, and, as a result, the crystal defects are reduced as compared with the case where the selective lateral growth is not performed. Furthermore, prolonging of the crystal defect toward an activity layer 6 is prevented by provision of a modulation doped strained-layer superlattice layer (MD-SLS) 5 formed thereon. Consequently, as compared with the case where the selective lateral growth and modulation doped strained-layer superlattice layer are not used, it becomes possible to lengthen the device life.

In the case of this first prior art, although it becomes possible to reduce the crystal defects as compared with the case where the selective lateral growth of a GaN film is not carried out on a sapphire substrate, the above-mentioned problems concerning the insulating property and cleavage by using a sapphire substrate still remain. Furthermore, as the $SiO_2$ mask formation process is added, the crystal growth by the MO-VPE apparatus is needed twice, and, thereby, a problem that a process is complicated newly arises.

As another method, for example, a document 'Applied Physics Letters, Vol. 73, No. 6, pages 832–834 (1998)' (referred to as a second prior art, hereinafter) discloses application of a GaN thick film substrate. By this second prior art, a GaN substrate is produced, by growing up a 200-micrometer GaN thick film by an H-VPE (hydride vapor phase growth) apparatus after 20-micrometer selective lateral growth according to the above-mentioned first prior art, and, then, grinding the GaN substrate thus having grown to be the thick film from the side of the sapphire substrate so that it may have the thickness of 150 micrometers. Then, the MO-VPE apparatus is used on this GaN substrate, crystal growth processes required for a LD device are performed, one by one, and, thus, the LD device is produced. Consequently, it becomes possible to solve the above-mentioned problems concerning the insulating property and cleavage by using the sapphire substrate in addition to solving the problem concerning the crystal defects.

A similar method is disclosed by Japanese Laid-Open Patent Application No. 11-4048. FIG. 2 shows a typical figure thereof.

However, further, the process is more complicated in the second prior art, and, requires the higher costs, in comparison to the first prior art. Moreover, in growing up the no less than 200-micrometer GaN thick film by the method of the second prior art, a stress occurring due to a lattice constant difference and a expansivity difference from the sapphire of the substrate becomes large, and a problem that the curvature and the crack of the substrate arise may newly occur. Moreover, even by performing such a complicated process, the crystal defective density can be reduced to only on the order of $10^6/cm^2$. Thus, it is still not possible to obtain a practical semiconductor device.

In order to solve this problem, setting to 1 mm or more thickness of an original substrate (sapphire and spinel are the most desirable materials as the substrate) from which a thick film grows is proposed by Japanese Laid-Open Patent Application No. 10-256662. According thereto, no curvature nor crack arise in the substrate even when the GaN film grows in 200 micrometers of thickness by applying this substrate having the thickness of 1 mm or more. However, a substrate thick in this way has a high cost of the substrate itself, and it is necessary to spend much time on polish thereof, and leads to the cost rise of the polish process. That is, as compared with the case where a thin substrate is used, the cost becomes higher by using the thick substrate. Moreover, although no curvature nor crack arise in the substrate after growing up the thick GaN film in using the thick substrate, curvature and/or crack may occur as a stress relief occurs during the process of polish. By this reason, even when the thick substrate is used, the GaN substrate having a high crystal quality and having such a large area that it can be practically used for an ordinary semiconductor device manufacturing process cannot be easily produced.

A document 'Journal of Crystal Growth, Vol. 189/190, pages. 153–158 (1998)' (referred to as a third prior art, hereinafter) discloses that a bulk crystal of GaN is grown up, and it is used as a homoepitaxial substrate. According to this technique, under the high temperature in the range between 1400 and 1700° C., and under the very high nitrogen pressure of 10 kilobars, crystal growth of the GaN is performed from a Ga liquid. In this case, it becomes possible to grow up a group-III nitride semiconductor film practically required for a device by using this GaN substrate. Therefore, it is possible to provide the GaN substrate without needing the process complicate like in the above-described first and second prior arts.

However, by this third prior art, crystal growth in high temperature and high pressure is needed, and, thus, there is a problem that a reaction vessel which can resist these conditions should become very expensive. In addition, even when such a growth method is employed, the size of the crystal obtained has the problem of being too small, i.e., at most on the order of 1 cm, and, thus, it is still too small to put it in practical use of semiconductor device manufacture.

The GaN crystal growth method using Na which is an alkaline metal as a flux is proposed by a document 'Chemistry of Materials, Vol. 9 (1977), pages 413–416' (referred to as a fourth prior art, hereinafter) as a technique of solving the problem of GaN crystal growth in the above-mentioned high temperature and high pressure. According to this technique, sodium azide ($NaN_3$) and Ga metal used as a flux and a material are sealed into a reaction vessel made from stainless steel (vessel inner dimension: diameter=7.5 mm and length= 100 mm) in nitrogen atmosphere, and the reaction vessel is maintained in the temperature in the range between 600 and 800° C. for 24 to 100 hours to grow up a GaN crystal. In the case of this fourth prior art, crystal growth at the comparatively low temperature in the range between 600 and 800° C. can be achieved, and, also, the require pressure inside the vessel should be only on the order of 100 kg/cm$^2$, which is comparatively lower than the case of the third prior art. However, in this fourth prior art, the size of the crystal obtained is small as less than 1 mm which is too small to be put into practical use in semiconductor device manufacture, like in the case of the third prior art.

Therefore, the applicant of the present application has proposed a method of enlarging a group-III nitride crystal yielded. However, in the method, nucleus generation initiates of the crystal growth is natural nucleus generation and, thus, a large number of nucleuses are undesirably generated. In order to control such a manner of nucleus generation, the applicant has proposed to utilize a seed crystal in the U.S. patent application Ser. No. 09/590,063, filed on Jun. 8, 2000, by Seiji Sarayama, et al. (the entire contents of which are hereby incorporated by reference). However, there is still a problem that a required crystal growth apparatus becomes somewhat complicated. Therefore, it has been demanded to realize a method for effectively controlling nucleus generation, while achieving a simple apparatus configuration of a conventional flux method, in order to solve this problem.

Further, Japanese Laid-Open Patent Application No. 2000-327495 discloses a fifth prior art combining the above-mentioned fourth prior art and an epitaxial method utilizing a substrate. In this method, a substrate on which GaN or AlN is grown previously is used, and, thereon, a GaN film according to the fourth prior art is grown. However, in this method, as it is basically the epitaxial method, the problem of crystal defects occurring in the above-mentioned first and second prior art cannot be solved. Further, as the GaN film or AlN film should be grown on the substrate previously, the process becomes complicated, and, thereby, the costs increase.

Furthermore, recently, Japanese Laid-Open Patent Applications Nos. 2000-12900 and 2000-22212 disclose a sixth prior art in which a GaAs substrate is used and a GaN thick-film substrate is produced. In this method, a GaN film having a thickness in a range between 70 μm and 1 mm is selectively grown on a GaAs substrate by using an $SiO_2$ film or SiN film as a mask as in the above-mentioned first prior art, as shown in FIGS. 3A through 3C,. The crystal growth there is performed by an H-VPE apparatus. Then, the GaAs substrate is etched and thus removed by using aqua regia. Thus, the GaN self-standing substrate is produced, as shown in FIG. 3D. By using this GaN-self standing substrate, a GaN crystal having a thickness of several tens of millimeters is grown by vapor phase epitaxy by the H-VPE apparatus again, as shown in FIG. 4A. Then, this GaN crystal of several tens millimeters is cut into wafer shapes by a slicer, as shown in FIG. 4B. Thus, GaN wafers are produced, as shown in FIG. 4C.

According to this sixth prior art, the GaN self-standing substrate can be obtained, and, also, the GaN crystal having the thickness of several tens of millimeters can be obtained. However, this method still has the following problems:

① As the SiN film or $SiO^2$ film is used as a mask for selective growth, the manufacturing process becomes complicated, and, thus, the costs increase;

② When the GaN crystal having the thickness of several tens millimeters is grown by the H-VPE apparatus, GaN crystals (in monocrystal or polycrystal) or amorphous GaN having a similar thickness adhere to the inner wall of the reaction vessel. Accordingly, the productivity is degraded.

③ As the GaAs substrate is etched and removed every time of the crystal growth as a sacrifice substrate, the costs increase.

④ With regard to the crystal quality, problems of lattice mismatch due to crystal growth on a different-substance substrate, and a high defect density due to difference in expansivity remain.

SUMMARY OF THE INVENTION

An object of the present invention is to achieve a group III nitride crystal having a sufficient size such that a semiconductor device, such as a high-efficient light emitting diode (LED) or LD can be produced therefrom, without complicating the process which is the problem in the above-mentioned first or the second prior art, without using an expensive reaction vessel which is the problem in the third prior art, and without provision of still insufficient size of the crystal which is the problem in the third and fourth prior arts, and, also, solving the above-mentioned problems in the fifth and sixth prior arts, and a crystal growth method and a crystal growth apparatus by which such a group-III nitride crystal can be yielded, and a high-performance group-III nitride semiconductor device may be obtained there.

The inventors of the present invention proposed various schemes by Japanese laid-open patent applications Nos.

2001-58900, 2001-64097, 2001-64098, 2001-102316 and 2001-119103 so as to solve the problems of the prior arts, in particular, the fourth prior art.

For example, in the Japanese laid-open patent application No. 2001-58900, a scheme of externally supplying a group-III material and a group-V material into a reaction vessel is proposed. In the Japanese laid-open patent application No. 2001-64097, a scheme of stably supplying a group-V material is proposed. In the Japanese laid-open patent application No. 2001-64098, a scheme of a crystal growth made from a seed crystal is proposed. Japanese laid-open patent application No. 2001-102316, a scheme of a crystal growth from a mixed molten liquid of a group-III metal and an alkaline metal is proposed. In Japanese laid-open patent application No. 2001-119103, a scheme of a crystal growth for a cubic crystal is proposed.

However, a relation of crystal growth condition, crystal mode, and availability of crystal growth in a process of a crystal growth for a group-III nitride crystal by using an alkaline metal has not been clearly understood.

Accordingly, another object of the present invention is to investigate a relation between a crystal growth condition and a crystal mode/availability of crystal growth, and, thereby, to efficiently achieve a crystal growth for a group-III nitride crystal under a practical crystal growth condition.

A group-III nitride crystal growth method according to the present invention, includes the steps of:

a) preparing a mixed molten liquid of an alkaline metal and a material at least comprising a group-III metal;

b) growing a group-III nitride crystal of the group-III metal and nitrogen from the mixed molten liquid and a material at least comprising nitrogen; and c) setting a predetermined crystal growth condition according to a zone defined by a pressure and a temperature in said step b).

Thus, by applying an appropriate zone of the crystal growth condition defined by the pressure and temperature in the crystal growth, a quality group-III nitride crystal in a desired crystal mode can be yielded with an improved controllability concerning the crystal growth.

For example, by first setting a seed crystal and also, setting the appropriate zone of the crystal growth condition, it is possible to control the crystal orientation, and, also, to define the position at which the crystal grows. Accordingly, it is possible to yield a single-crystalline group-III crystal of a large size, having a desired crystal orientation suitable for being utilized as a material of a substrate for a semiconductor device.

Further, by supplying an inactive gas such as an argon gas other than the group-V material (N), it is possible to effectively reduce evaporation of the alkaline metal from the mixed molten liquid while the group-V material can be continuously supplied. In fact, as mentioned above, it is preferable to apply an appropriate zone of crystal growth condition defined by the pressure and temperature of the materials for a target group-III nitride crystal. The pressure of the material (group-V material) should fall within a predetermined range, while the total pressure applied to the mixed molten liquid is preferably increased so as to reduce evaporation of the alkaline metal so as to ensure desired crystal growth conditions. By supplying the inactive gas so as to increase the total pressure applied to the mixed molten liquid, it is possible that the above-mentioned pressure condition on the group-V material (N) positively fall within the predetermined range while evaporation of the alkaline metal from the mixed molten liquid can be effectively reduced.

Furthermore, especially in a case where the zone of the crystal growth condition such that a plate-shaped crystal may dominantly grow is applied, it is preferable that crystal growth be performed along the gas-to-liquid interface between the group-V material gas and the mixed molten liquid. Thereby, growth of the plate-shaped crystal is effectively promoted, and, thus, efficient crystal growth for a plate-shaped crystal having a large area is achieved.

Furthermore, by beforehand setting a seed crystal in a condition in which a desired crystal plane is made parallel to the gas-to-liquid interface, it is possible to yield a plate-shaped crystal having the main surface of the desired crystal plane. Thereby, it is possible to create a device which functions inherently according to a particular surface orientation of a substrate applied which employs the thus-yielded crystal in which the surface orientation is thus clearly understood. Further, by producing a plate-shaped crystal having the a-plane or m-plane other than the C-plane as the main surface thereof by the same method, chip cutting for creating strips can be easily and positively achieved.

As a method of maintaining the crystal growth same as the height of the gas-to-liquid interface as mentioned above, a method of fixing the gas-to-liquid interface may be applied. Thereby, even in a case where a crystal grows from an inner wall of a mixed molten liquid container, this crystal can be made further grow at the same height on the gas-to-liquid interface. As another method, a crystal on growth may be moved according to the lowering of the gas-to-liquid interface due to material consumption. This method is useful when fixing of the height of the gas-to-liquid interface is difficult. Another method is to provide a means for causing a crystal on growth to float on the gas-to-liquid interface. This method may be achieved with a simpler configuration so as to prevent a crystal coming to have a heavy weight as a result of own growth from sinking into the mixed molten liquid by the own weight.

Furthermore, by providing a heating device for heating the mixed molten liquid, inside of the reaction vessel, the controllability of temperature distribution within the reaction vessel can be effectively improved. In this case, it is preferable to provide a further inner vessel between the mixed molten liquid container and the reaction vessel. Thereby, it is possible to effectively avoid corrosion of the heating device which is provided immediately outside of the inner vessel so that it is prevented from being exposed to the alkaline metal steam. Further, it is preferable to make thinner the wall of the inner vessel so as to improve the controllability of the temperature distribution around the mixed molten liquid performed by the heating device. By making smaller the pressure difference between the inside and outside of the inner vessel, it is possible to make thinner the wall of the inner vessel.

Thereby, it is possible to improve the efficiency of crystal growth, to yield a large-size single-crystalline group-III nitride crystal with a simplified crystal growth apparatus.

BRIEF DESCRIPTION OF THE DRAWINGS

Other objects and further features of the present invention will become more apparent from the following detailed description when read in conjunction with the accompanying drawings.

FIGS. 7, 8A, 8B and 9 show various examples of group-III nitride crystals yielded according to the present invention;

DETAILED DESCRIPTION OF THE PREFERRED EMBODIMENTS

Embodiments of the present invention will now be described.

Figure 5:
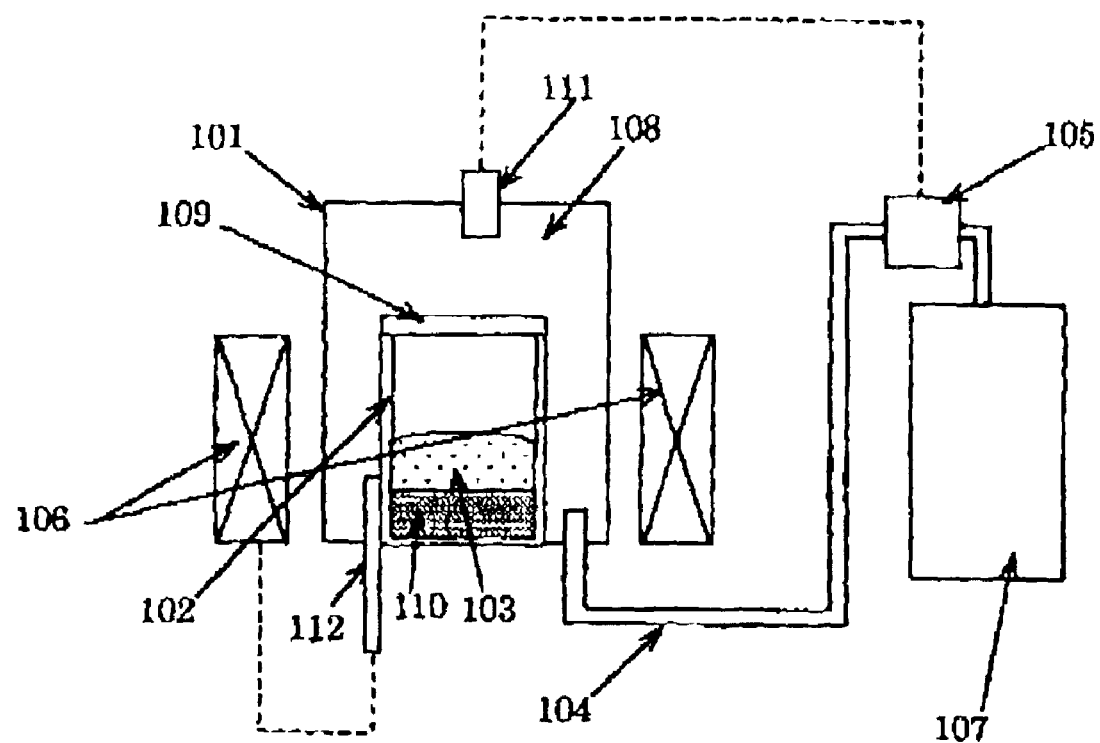
FIG. 5 shows a side-elevational sectional view of a crystal growth apparatus in any of first through fourteenth embodiments of the present invention.

According to a first embodiment of the present invention, as shown in FIG. 5, a mixed molten liquid 103 is produced of an alkaline metal and a material at least containing a group-III metal in a reaction vessel 101. Then, from the mixed molten liquid and a material at least containing nitrogen, a group-III crystal 110 made of the group-III metal and nitrogen is made to grow. In this process, the group-III nitride crystal is made to grow in predetermined conditions defined with respect to a pressure and temperature in the reaction vessel.

As the above-mentioned group-III metal, Ga, aluminum, In, or the like may be used. As the alkaline metal, K, Na, or the like may be used. Moreover, the material at least containing nitrogen may be a compound which contains nitrogen as a constituent, such as a nitrogen gas, sodium azide, ammonia, or the like. The pressure defined as the crystal growth condition is a pressure of a space in the reaction vessel. Similarly, the temperature defined as the crystal growth condition is a temperature inside or on the surface of the mixed molten liquid in which the crystal growth takes place.

According to the first embodiment, crystal growth is made to take place according to the following process. The alkaline metal, the material which contains the group-III metal at least, and the material which contains nitrogen at least are provided into the reaction vessel. Then, by raising the temperature of this reaction vessel to a temperature in which crystal growth may take place, and, also, by setting the effective nitrogen partial pressure in the reaction vessel into the condition such that a group-III nitride crystal may take place, the crystal growth of group-III nitride starts, and, then, the crystal growth of the group-III nitride can be made to continue positively.

Thus, by the group-III nitride crystal growth method according to the first embodiment of the present invention, in the reaction vessel, the alkaline metal and the material which contains group-III metal at least form the mixed molten liquid. Then, a group-III nitride including the group-III metal and nitrogen is made to grow from the above-mentioned mixed molten liquid and the material which contains the nitrogen at least, in conditions corresponding to a predetermined zone defined with respect to the pressure and temperature in the reaction vessel (see FIG. 6). Thereby, the group-III nitride crystal (for example, a group-III nitride crystal in particular used as a substrate used for growing a crystal film of group-III nitride) can be obtained easily. Namely, it becomes possible to obtain a group-III nitride crystal of high quality, and a semiconductor device using it at low cost, without needing a complicated process which was needed according to the above-mentioned second prior art, for example.

Moreover, crystal growth of a group-III nitride is made possible even under conditions of as low as 1000 degrees C. of growth temperature, and also, as low as 100 atms or less of growth pressure. Thereby, it is not necessary to use an expensive reaction vessel which can bear a super-high pressure and a super-high temperature needed in the third prior art. Consequently, it becomes possible to finally obtain a semiconductor device using a group-III nitride crystal at low cost.

Furthermore, under the crystal growth conditions corresponding to the zone defined with respect to the pressure and temperature in the reaction vessel, the crystal of group-III nitride is made to grow up. Accordingly, it becomes possible to improve the controllability of crystal growth remarkably and thus, to be able to obtain a desired crystal mode easily.

In other words, since a crystal of group-III nitride is made to grow up under the crystal growth conditions corresponding to the zone defined with respect to the pressure and temperature, the condition controllability so as to achieve growing up a high-quality group-III nitride crystal using the mixed molten liquid can be improved. That is, it becomes possible to grow up a satisfactory group-III nitride crystal by appropriately controlling the pressure and temperature in the reaction vessel.

A second embodiment of the present invention will now be described. According to the second embodiment, in addition to the group-III nitride crystal growth method of the first embodiment described above (see FIG. 5), the second embodiment is characterized by a feature in that a crystal of group-III nitride having a different crystal mode can be made to grow for each of a plurality of zones defined with respect to the pressure and temperature as the crystal growth conditions (see FIG. 6).

Thereby, it is possible to improve the controllability in the crystal growth remarkably and, thus, a crystal in a desired crystal mode can be obtained easily.

A third embodiment of the present invention will now be described. According to the third embodiment, one of the above-mentioned plurality of zones as the crystal growth conditions (see FIG. 6) is such that crystal growth is made from a seed crystal.

Thereby, in this method, crystal growth can be made to occur only from a prepared seed crystal concentrated. Accordingly, as almost none of crystal growth at other portions occur, raw materials can be consumed efficiently, and, thus, it becomes possible to produce a large-sized group-III nitride single crystal. Moreover, such a large-sized single crystal can be made to grow up at a predetermined position having the seed crystal prepared. Furthermore, it becomes possible to also control the crystal orientation of the crystal which grows, by controlling the crystal orientation of the seed crystal, and, thus, it becomes easy to use the intended crystal orientation when it is used as a substrate.

A fourth embodiment of the present invention will now be described. According to the fourth embodiment, the above-mentioned zones of the crystal growth conditions for determining crystal growth mode are defined by the following formula (1).

$$\log P = a/T + b$$

where, P denotes the effective nitrogen pressure (Pa) in the reaction vessel 101; T denotes the absolute temperature (K) of the mixed molten liquid 103, and a and b denote coefficients.

Thus, it becomes possible to achieve growing up of a satisfactory group-III nitride crystal by providing an appropriately crystal growth conditions (see FIG. 6) according to the above-mentioned formula (1). In more detail, by determining the pressure and temperature according to the formula (1), it becomes possible to grow up a group-III nitride crystal having a desired crystal mode which will be described later.

According to a fifth embodiment of the present invention, the boundary of zones defined by the above-mentioned mentioned formula (1) can be controlled by the ratio of the group-III metal and the alkaline metal used,for the crystal growth.

Thus, the growth condition zone (see FIG. 6) can be easily controlled.

According to a sixth embodiment of the present invention, as the above-mentioned seed crystal according to the third embodiment, a seed crystal of group-III nitride is used.

Thereby, it becomes possible to produce a large-sized group-III nitride single crystal, in addition to the advantages described above as in the third embodiment.

According to a seventh embodiment of the present invention, a pillar-shaped crystal is made to grow (as one mode of crystal growth) in the zone of the crystal growth condition mentioned above in which a pillar-shaped crystal can grow (as an another mode of crystal growth).

Thus, in the seventh embodiment, since crystal growth for a crystal of group-III nitride is carried out in the crystal growth condition zone in which crystal growth may occur in a pillar-shaped crystal, it becomes possible to grow up a quality pillar-shaped crystal. That is, according to the seventh embodiment, such a crystal growth condition zone that pillar-shaped crystals grow dominantly is used. In such a pillar-shaped crystal, the surface orientation thereof can be clearly understood. Therefore, when producing a group-III nitride substrate from such a pillar-shaped crystal, determination of the crystal plane and thus appropriately slicing thereof can be achieved easily.

According to an eighth embodiment of the present invention, crystal growth is carried out in such a crystal growth condition zone that plate-shaped crystals grow dominantly (as an another mode of crystal growth). Thereby, it is possible to produce quality plate-shaped crystals of group-III nitride. That is, in the above-mentioned crystal growth condition zone, plate-shaped crystals grow dominantly, and, thus, the yielded crystals can be easily used as group-III nitride substrate. That is, it is possible to use the plate-shaped crystal as a group-III nitride substrate as it is. Alternatively, even when there is surface unevenness on the yielded crystal, it can be used as a group-III nitride substrate only after carrying out surface polish thereon. Moreover, in this method, the surface orientation can be clearly understood, and, thus, use thereof as a substrate is achieved easier. Furthermore, in crystal growth in this crystal growth condition zone, crystal growth along the surface orientation occurs at high speed. Accordingly, a group-III nitride crystal can be made to grow efficiently, thus, resulting in low production cost required.

According to group-III nitride crystal growth in a ninth embodiment of the present invention, sodium (Na) is used as the above-mentioned alkaline metal; gallium (Ga) is used as the material which contains group-III metal at least; and as the material which contains nitrogen at least, nitrogen gas ($N_2$) is used, In this method, as the group-III nitride, a crystal of gallium nitride (GaN) is made to grow. In this process, the crystal growth conditions are defined by the pressure of the nitrogen gas, and the temperature of the mixed molten liquid of gallium and sodium (see FIG. 6).

Thereby, it becomes possible to grow up a quality GaN crystal with sufficiently controlled crystal quality. That is, since the nitrogen gas is used, control of the pressure becomes easier. Furthermore, since Na and Ga are used, Na and Ga are mixed uniformly and thus, it becomes possible to well control the temperature of the entire materials. Therefore, a control can be easily made into a desired crystal mode by controlling the nitrogen gas pressure and the temperature of the mixed molten liquid. Thus, it becomes possible to grow up a GaN crystal of a desired crystal mode easily according to the respective zones of the crystal growth conditions according to FIG. 6.

According to a tenth embodiment of the present invention, under the crystal growth condition zone expressed by the following formula (2), crystal growth of the gallium nitride (GaN) is performed using a seed crystal.

$$a1/T + b1 \leq \log P \leq a2/T + b2 \tag{2}$$

where, P denotes the nitrogen gas pressure (Pa), T denotes the absolute temperature (K) of the mixed molten liquid, and a1, b1, a2, and b2 denote coefficients, respectively. Specifically, a1=−5.40×10⁻³, b1=4.83, a2=−5.59×10⁻³, and b2=5.47.

Figure 6:
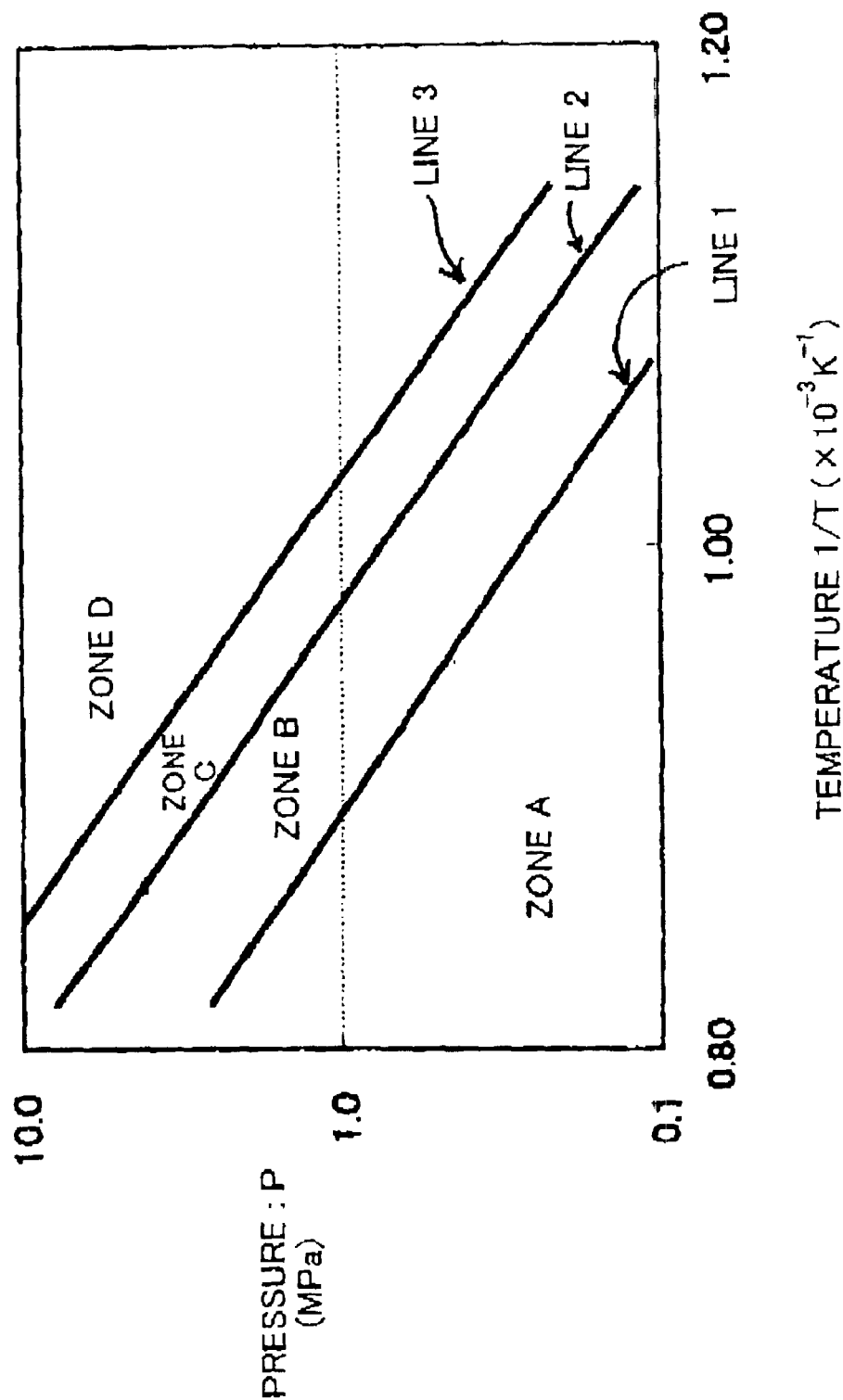
FIG. 6 shows a relationship between a temperature and a pressure of crystal growth conditions for group-III nitride crystals according to the present invention.

In the above-mentioned crystal growth conditions, a gallium nitride (GaN) crystal is made to grow from a seed crystal therefor (zone B of FIG. 6). By controlling the pressure and temperature according to the above-mentioned formula (2), the crystal growth can be made to occur effectively from a seed crystal. That is, in the above-mentioned crystal growth condition zone B defined by the formula (2), crystal growth carried out based on a seed crystal is dominant, and thus, crystal growth in other modes hardly occurs. Accordingly, consumption of the materials can be effectively reduced, while it becomes possible to produce a large-sized group-III nitride single crystal. Moreover, such a large-sized single crystal can be made to grow up at a predetermined position having a seed crystal set first. Furthermore, it becomes possible to also control the crystal orientation of the crystal which grows by controlling the crystal orientation of a seed crystal and it becomes easy to use the crystal orientation when using the crystal in a substrate for semiconductor device.

According to an eleventh embodiment of the present invention, based on the above-described ninth embodiment, crystal growth for a pillar-shaped crystal (GaN) is made to grow under the crystal growth condition zone expressed by the following formula (3).

$$a2/T + b2 \leq \log P \leq a3/T + b3 \quad (3)$$

where P denotes the nitrogen gas pressure (Pa), T denotes the absolute temperature (K) of the mixed molten liquid, and a2, b2, a3, and b3 are coefficients, i.e., $a2 = -5.59 \times 10^{-3}$, $b2 = 5.47$, $a3 = -5.67 \times 10^{-3}$, and $b3 = 5.83$.

Thereby, it becomes possible to grow up a pillar-shaped gallium nitride (GaN) crystal have well-controlled crystal quality. That is, in the above-mentioned crystal growth condition zone (zone C of FIG. 6) according to the formula (3), since pillar-shaped crystals grow dominantly, crystals for which the surface orientation can be easily understood can be obtained. Therefore, when producing a group-III nitride substrate based on such a pillar-shaped crystal, determination of the surface orientation and thus slicing thereof along a proper plane can be easily achieved. Moreover, in this crystal growth condition zone C, a pillar-shaped crystal grows in a manner of spontaneous nucleus occurrence without needing any seed crystal. Accordingly, a pillar-shaped crystal obtained according to the eleventh embodiment may be used as a seed crystal for performing crystal growth according to the above-mentioned tenth embodiment.

A twelfth embodiment of the present invention will now be described. Based on the group-III nitride crystal growth method according to the above-described ninth embodiment, the crystal growth condition zone (zone D of FIG. 6) expressed by the following formula (4) is used for growing up a plate-shaped gallium nitride (GaN) crystal:

$$a3/T + b3 \leq \log P \quad (4)$$

where P denotes the nitrogen gas pressure (Pa), T denotes the absolute temperature (K) of the mixed molten liquid, and a3 and b3 are coefficients, i.e, $a3 = -5.67 \times 10^{-3}$ and $b3 = 5.83$.

Thereby, a quality plate-shaped crystal can be made to grow. That is, in the above-mentioned crystal growth condition zone D of the formula (4), since plate-shaped crystals grow dominantly, it is easy to use the product as a group-III nitride substrate. That is, it is possible to use this plate-shaped crystal as a group-III nitride substrate as it is. Alternatively, even when there is surface unevenness, it can be used as a group-III nitride substrate only after carrying out surface polish thereon. Moreover, as the surface orientation can be easily understood thereon, use thereof as a substrate can be easily achieved. Furthermore, in crystal growth in this crystal growth condition zone D, crystal growth of a plate-shaped crystal along the surface orientation proceeds at high speed. Accordingly, a group-III nitride crystal can be made to grow efficiently, resulting in low production cost. Moreover, in this crystal growth condition zone D, the plate-shaped crystal grows in a manner of spontaneous nucleus occurrence without needing any seed crystal. Accordingly, the plate-shaped crystal produced according to the twelfth embodiment may be used as a seed crystal for crystal growth according to the tenth embodiment described above.

A thirteenth embodiment of the present invention is a group-III nitride crystal produced according to the group-III nitride crystal growth method in any of the above-described first through twelfth embodiments.

Since the group-III nitride crystal is produced according to the group-III nitride crystal growth method in any of the above-described embodiments of the present invention, it has a high crystal quality.

A fourteenth embodiment of the present invention is a semiconductor device produced by using the group-III nitride crystal according to the thirteenth embodiment. As the group-III nitride crystal according to the present invention has a high crystal quality as described above, it is possible to provide a quality semiconductor device.

The above-mentioned semiconductor device may be used in an optical device or may be used in an electronic device.

Each of the above-described embodiments will now be described again in detail with reference to figures.

FIG. 5 shows an example of a crystal growth apparatus which may be used for the group-III nitride crystal growth method according to any of the above-described embodiments of the present invention.

As shown in the figure, a mixed molten liquid container 102 holding a mixed molten liquid 103 of an alkaline metal (for example, Na) and a material which contains a group-III metal (for example, Ga) at least is provided in a reaction vessel 101.

The alkaline metal (Na) may be supplied from the outside, or may exist in the reaction vessel 101 beforehand.

Moreover, a lid 109 is provided on the mixed molten liquid container 102, and a slight gap is provided between the mixed molten liquid container 102 and the lid 109 such that a gas may communicate therethrough.

The reaction vessel 101 is formed by stainless steel. The mixed molten liquid container 102 is formed by BN (boron nitride), AlN, or pyrolytic BN.

A heating device 106 for controlling the inside temperature of the reaction vessel 101 into such a temperature that crystal growth for a group-III nitride (GaN) may occur in the reaction vessel 101. Through temperature control performed with the heating device 106, the temperature inside of the reaction vessel 101 can be controlled into a temperature in which the relevant crystal growth may occur, or into a temperature in which the crystal growth may not occur, and also, to maintain each of these temperatures in the reaction vessel 101 arbitrarily.

Moreover, a supply pipe 104 for supplying a material (for example, nitrogen gas, ammonia gas, or sodium azide) which contains nitrogen at least into the reaction vessel 101 is formed in the group-III nitride crystal growth apparatus shown in FIG. 5. The above-mentioned material containing nitrogen at least means nitrogen molecules, molecules produced from a compound containing nitrogen, nitrogen in the form of nitrogen atoms, atomic groups or molecular groups containing nitrogen.

The material which contains nitrogen at least is contained by the container 107. A nitrogen gas is supplied into the container 107 when the nitrogen gas is used as the material which contains nitrogen at least.

Moreover, when using a nitrogen gas as the material which contains nitrogen at least, the supply pipe 104 has a pressure adjustment mechanism (for example, a pressure regulator valve) 105 provided therein, in order to adjust the pressure of the nitrogen gas. Moreover, in the apparatus shown in FIG. 5, a pressure sensor 111 which detects the pressure of the nitrogen gas in the reaction vessel 101, and a temperature sensor 112 which detects the temperature of the mixed molten liquid container 102 are provided. The pressure sensor 111 is configured so that feedback may be provided to the pressure adjustment mechanism 105, and, thereby, the pressure in the reaction vessel 101 can be controlled into a predetermined pressure. Moreover, the temperature sensor 112 is configured so that feedback may be provided to the heating device 106.

According to the embodiment of the present invention, the nitrogen gas is supplied to a space 108 in the reaction vessel 101 through the supply pipe 104 from a container 107 provided out of the reaction vessel 101. As shown in the figure, the nitrogen gas is made to be supplied from the bottom of the reaction vessel 101. The pressure adjustment mechanism 105 can adjust the pressure of this nitrogen gas there.

When growing up a crystal of group-III nitride (GaN) using the apparatus shown in FIG. 5, the temperature and pressure in the reaction vessel 101 are set as a predetermined temperature and a predetermined pressure, respectively. Then, the GaN crystal 110 grows as the group-III nitride crystal in the mixed molten liquid container 102 as a result of the state being maintained for a fixed time. In this case, the crystal growth mode for the GaN crystal 110 differs according to the temperature and pressure of the growth conditions according to the relationship shown in FIG. 6.

FIG. 6 shows the relationship between the temperature and pressure of the crystal growth conditions. In FIG. 6, the vertical axis denotes the nitrogen pressure in the reaction vessel 101, while the horizontal axis denotes the reciprocal of the temperature (absolute temperature) of the mixed molten liquid 103.

In FIG. 6, the zone A is a zone of crystal growth conditions where no GaN crystal may grow. The zone B is a zone of crystal growth conditions in which GaN crystals may grow dominantly only from seed crystals. The zone C is a zone of crystal growth conditions in which pillar-shaped GaN crystals may grow dominantly. The zone D is a zone of crystal growth conditions in which plate-shaped GaN crystals may grow dominantly. The above-mentioned term "dominantly" means that the majority of crystal growth occurring there is in the relevant mode.

The above-mentioned pillar-shaped gallium nitride (GaN) crystals which grow dominantly in the zone C are hexagonal GaN crystals in which the crystals extend along the C-axis <0001>. The above-mentioned plate-shaped gallium nitride (GaN) crystals which grow dominantly in the zone D are hexagonal GaN crystals in which the crystals extend along the C-plane, i.e, the (0001) plane.

The zone A is a zone in which the pressure is lower, and the temperature is higher (1/T is smaller), than the line 1. The zone B is a zone defined between the lines 1 and 2. The zone C is a zone defined between the lines 2 and 3. The zone D is a zone in which the pressure is higher, and the temperature is lower (1/T is larger), then the line 3.

The inventors of the present invention and so forth experimentally found out that the above-mentioned lines 1, 2 and 3 are expressed as follows:

That is, the line 1 is expressed by the following formula (5):

$$\log P = a1/T + b1 \quad (5)$$

where P denotes the nitrogen gas pressure (Pa), T denotes the absolute temperature (K) of the mixed molten liquid, and, a1 and b1 are coefficients, i.e., $a1=-5.40\times10^{-3}$ and $b1=4.83$.

Moreover, the line 2 is expressed by the following formula (6):

$$\log P = a2/T + b2 \quad (6)$$

where P denotes the nitrogen gas pressure (Pa), T denotes the absolute temperature (K) of the mixed molten liquid, and a2 and b2 are coefficients, i.e., $a2=-5.59\times10^{-3}$ and $b2=5.47$.

The line 3 is expressed by the following formula (7):

$$\log P = a3/T + b3 \quad (7)$$

where, P denotes the nitrogen gas pressure (Pa), T denotes the absolute temperature (K) of the mixed molten liquid, and a3 and b3 are coefficients, i.e., $a3=-5.67\times10^{-3}$ and $b3=5.83$.

The above-mentioned formula (2) means that the nitrogen gas pressure should fall within the zone B between the line 1 and line 2. The formula (3) means that the nitrogen gas pressure should fall within the zone C between the line 2 and line 3. The formula (4) means that the nitrogen gas pressure should fall within the zone D higher the line 3.

First, a case where a GaN crystal is made to grow up using the crystal growth conditions of the zone B shown in FIG. 6 will now be described. In this zone B, crystal growth is carried out dominantly from a seed crystal. Therefore, at any place other than the prepared seed crystal, any crystal nucleolus and thus crystal growth hardly occur.

Specifically, in case the crystal growth apparatus shown in FIG. 5 is used, and, as crystal growth conditions, the nitrogen gas pressure is set as 2 MPa, and the molten liquid temperature is set as 850 degrees C. ($1/T=8.9\times10^{-4}$ ($K^{-1}$)). Then, GaN crystal growth is made to occur there. As a result, crystal growth as shown in FIG. 7 occurs. That is, the GaN crystal 301 used as a seed crystal is set in the mixed molten liquid 103 of FIG. 5, and, then, the above-mentioned growth conditions (nitrogen gas pressure: 2 MPa; and molten liquid temperature: 850 degrees C.) are maintained. Then, based on the seed crystal 301, a GaN crystal grows greatly so as to yield a GaN crystal 302.

There, a hexagonal-pillar-like crystal is used as the seed crystal 301, then, a crystal grows up around the seed crystal 301, and thus, the large GaN crystal is yielded. In FIG. 7, the top and bottom surfaces of the hexagonal pillar of the crystal are the planes of (0001).

In the zone B of FIG. 6, since crystal growth occurs dominantly from a seed crystal, crystal growth hardly occurs in any other places. As a result, efficient consumption of the materials is attained. In other words, almost all the materials are consumed as the GaN crystal which grows from the seed crystal. Accordingly, the metal Ga prepared first is used efficiently. Consequently, it becomes possible to grow up a bigger GaN crystal.

Moreover, since crystal growth can be carried out based on the seed crystal, control of crystal orientation can be performed in an easier way. Especially, precision control of crystal orientation is attained by using a GaN crystal for which the crystal orientation is clearly understood beforehand as the seed crystal. Consequently, in case the yielded crystal is finally sliced into a GaN substrate, the surface orientation thereof can be easily understood.

Moreover, a GaN crystal obtained according to this way has a high quality with an effectively reduced defective density.

In this example, hexagonal-pillar-like seed crystal is used. However, it is also possible to instead use a plate-shaped crystal as a seed crystal as will be described later. Moreover, it is also possible to carry out crystal growth on an epitaxial film as described in the description of the prior art above. In this case, a big plate-shaped GaN crystal can be yielded.

A case where a GaN crystal is made to grow up using the crystal growth conditions of the zone C of FIG. 6 will now be described. In this zone C, a pillar-shaped crystal grows dominantly.

A pillar-shaped crystal 401 grows for example as shown in FIGS. 8A or 8B, when the nitrogen gas pressure is set to 3 MPa, and the molten liquid temperature is set to 800 degrees C. ($1/T=9.32 \times 10^{-4}$ ($K^{-1}$)) as the crystal growth conditions so as to grow up a GaN crystal, using the crystal growth apparatus of FIG. 5. That is, by maintaining the above-mentioned crystal growth conditions (nitrogen gas pressure: 3 MPa and molten liquid temperature: 800 degrees C.) in the crystal growth apparatus shown in FIG. 5 for a predetermined time interval, the GaN crystal 401 in the form of FIGS. 8A or 8B grows in the mixed molten liquid 103.

The GaN crystal 401 which grows as shown in FIG. 8A has a shape of a hexagonal pillar, while the GaN crystal 401 which grows as shown in FIG. 8B has a shape of stacking a hexagonal pyramid on a hexagonal prism. In either case of FIG. 8A or 8B, the GaN crystal 401 extends in the direction of the C-axis with the top and bottom surfaces of C-planes (0001).

In the zone C of FIG. 6, since a pillar-shaped crystal grows dominantly as mentioned above, the surface orientation thereof can be clearly understood. Therefore, when producing a GaN substrate based on this pillar-shaped crystal, determination of the surface orientation and thus slicing thereof accordingly can be easily performed.

Moreover, in this zone C, a pillar-shaped crystal grows in a spontaneous nucleolus occurrence manner without needing any seed crystals. Accordingly, the thus-yielded pillar-shaped crystal may be used as a seed crystal to be used in crystal growth in the zone B described above.

A case where a GaN crystal is made to grow up using the crystal growth conditions of the zone D shown in FIG. 6 will now be described. In this zone D, a plate-shaped crystal grows dominantly.

Specifically, by setting the nitrogen gas pressure to 5 MPa, and the molten liquid temperature to 750 degrees C. ($1/T=9.77 \times 10^{-4}$ ($K^{-1}$)) as the crystal growth conditions such as to grow up a GaN crystal using the crystal growth apparatus of FIG. 6, a plate-shaped crystal 501 as shown in FIG. 9 grows. That is, in the crystal growth apparatus of FIG. 5, the GaN crystal 501 having in the mode shown in FIG. 9 grows up inside of the mixed molten liquid 103 or the molten liquid surface, by maintaining for a predetermined interval the above-mentioned crystal growth conditions (nitrogen gas pressure: 5 MPa and molten liquid temperature: 750 degrees C.).

As a GaN crystal 501 growing up under the crystal growth conditions of the zone D of FIG. 6, not only a hexagonal plate-shaped crystal shown in FIG. 9 but also another polygonal plate-shaped crystal may grow. However, in any case, the yielded crystal has a mode of extending along the C-plane (0001).

In this zone D, since a plate-shaped crystal grows dominantly, the yielded crystal can be easily utilized as a GaN substrate. It is possible to use this plate-shaped crystal as a GaN substrate as it is. Or even when there is surface unevenness, it can be used as a GaN substrate only after carrying out surface polish thereon. Moreover, also as the surface orientation thereof can be easily understood as mentioned above, the yielded crystal can be easily used as a substrate for a semiconductor device.

Furthermore, in crystal growth in this zone D, crystal growth proceeds at high speed especially along the crystal plane direction. Accordingly, a GaN crystal can be made to grow efficiently, and, thus, cost saving can be achieved accordingly.

Moreover, in this zone D, a plate-shaped crystal grows in a spontaneous nucleus occurrence manner without needing any seed crystal. Accordingly, a yielded crystal may be utilized as a seed crystal for crystal growth performed in the zone B in a case, Moreover, by using a group-III nitride crystal thus grown up by the growth method according to the present invention (including any of the first through twenty-fifth embodiments), a group-III nitride semiconductor device can be produced.

Figure 10:
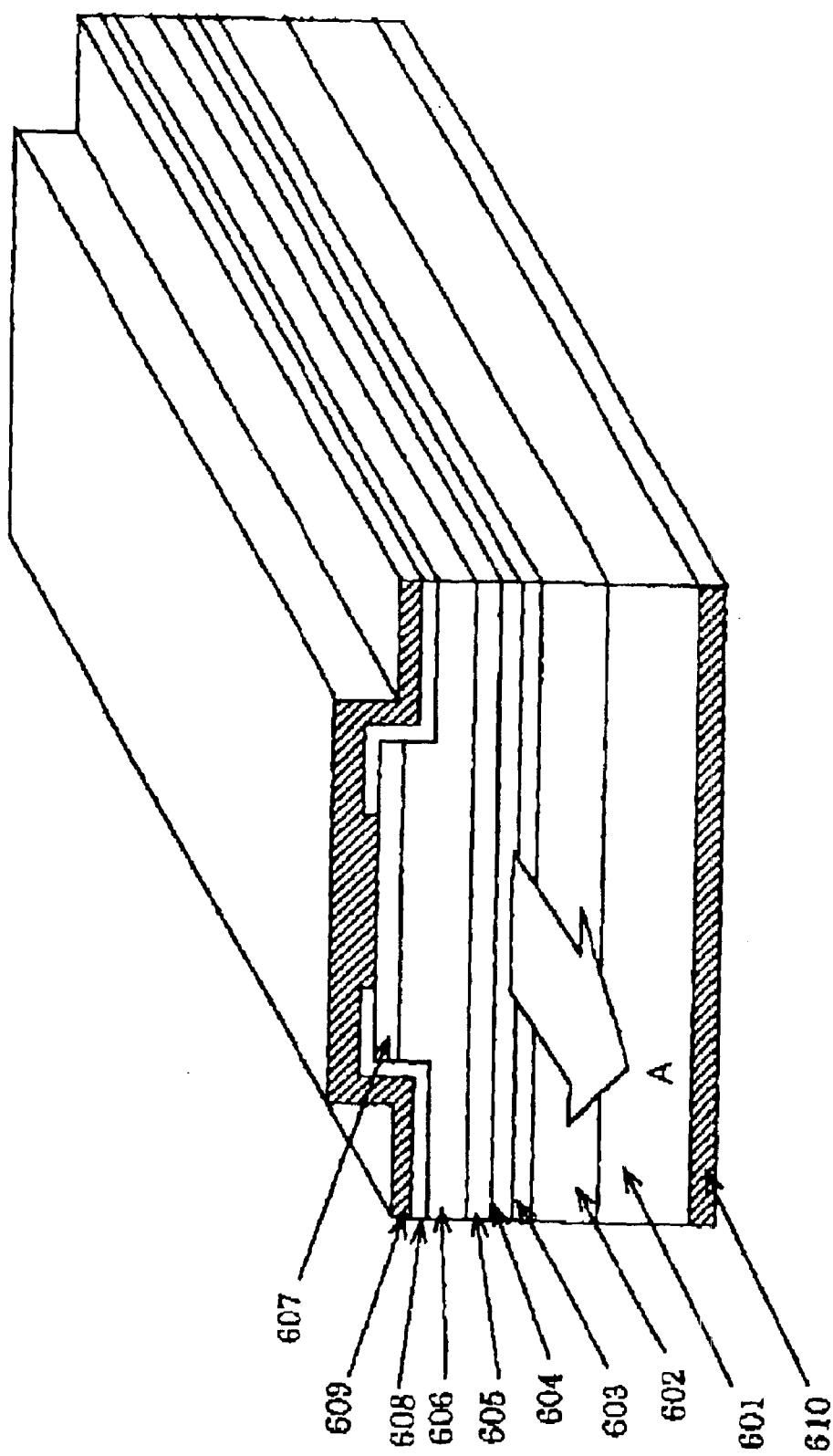
FIG. 10 shows a perspective view of one example of a semiconductor laser to which a group-III nitride semiconductor device produced by a crystal growth apparatus/method according to any embodiment of the present invention described in the present application is applied.

FIG. 10 shows an example of configuration of such a semiconductor device according to the present invention. The semiconductor device shown in FIG. 10 is in a form of a semiconductor laser. As shown in the figure, in this semiconductor device, on an n-type GaN substrate 601 using a group-III nitride crystal produced according to the above-described crystal growth method according to the present invention, an n-type AlGaN clad layer 602, an n-type GaN guide layer 603, an InGaN MQW (multiple quantum well) activity layer 604, a p-type GaN guide layer 606, a p-type AlGaN clad layer 606, and a p-type GaN contact layer 607 are formed one by one through crystal growth processes. As the crystal growth method therefor, a thin film crystal growth method, such as an MO-VPE (organometallic vapor phase epitaxy) method, an MBE (molecular beam epitaxy) method, or the like may be used.

Subsequently, a ridge structure is formed in the laminated films of GaN, AlGaN, and InGaN, $SiO_2$ insulating layer 608 is formed only with a hole formed as a contact region, a p-side ohmic electrode Au/Ni 609, and an n-side ohmic electrode Al/Ti 610 are respectively formed on top and bottom thereof, and thus, a semiconductor device (semiconductor laser) shown in FIG. 10 is formed.

By injecting an electric current from the p-side ohmic electrode Au/Ni 609 and n-side ohmic electrode Al/Ti 610 of this semiconductor laser, it oscillates, and emits laser light in a direction of an arrow A shown in FIG. 10.

Figure 1:
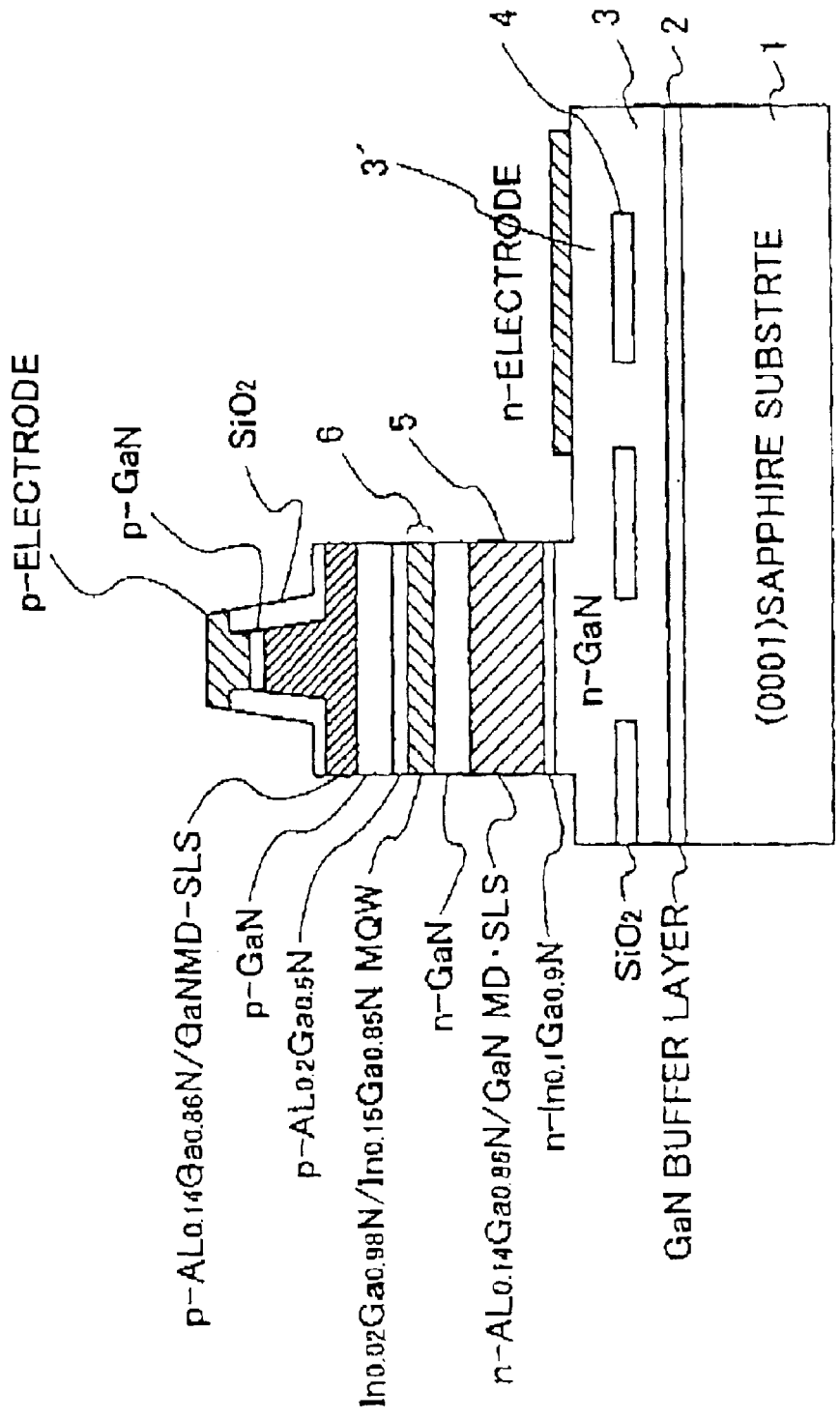
FIG. 1 shows a side-elevational sectional view of a semiconductor laser in the first prior art.
Figure 2:
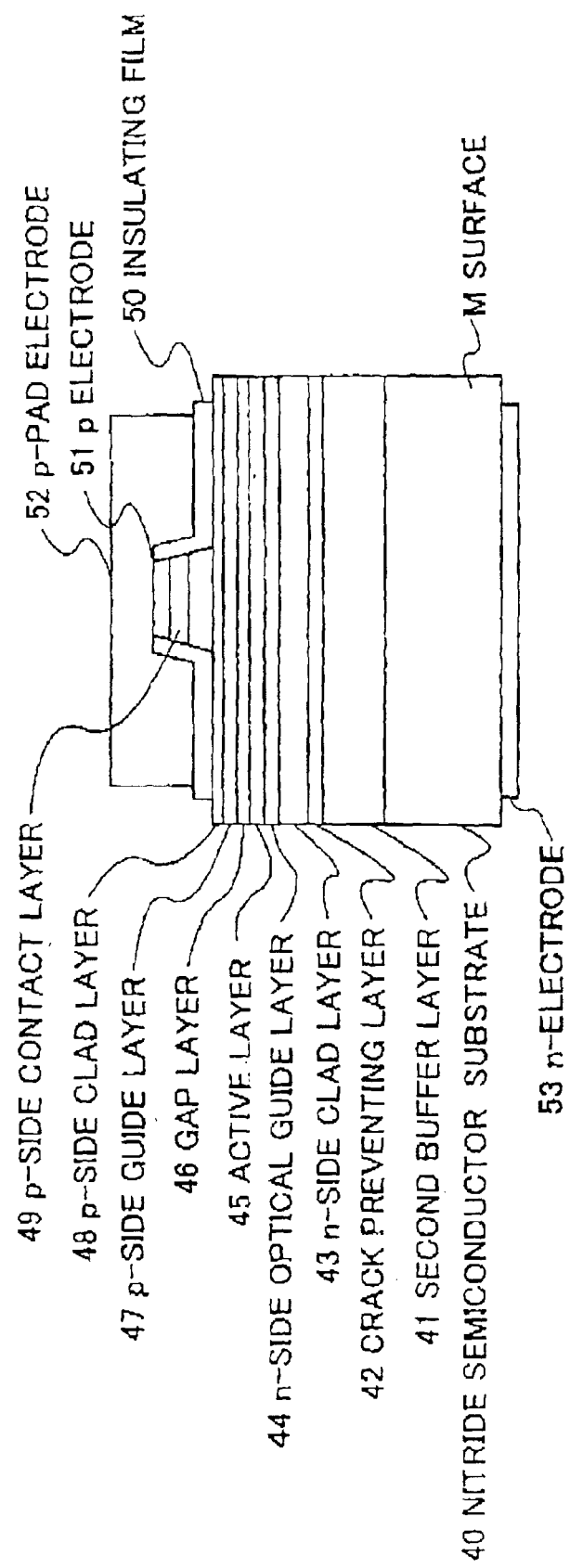
FIG. 2 shows a side-elevational sectional view of a semiconductor laser in the second prior art.
Figure 3A:
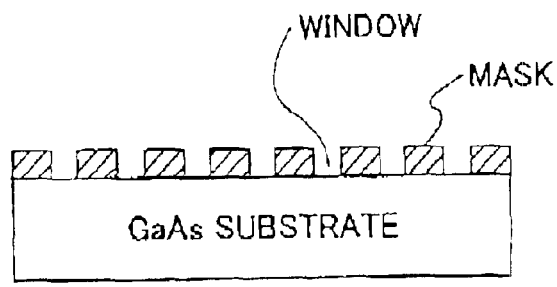
FIGS. 3A through 3D and 4A through 4C illustrate the sixth prior art.
Figure 3B:
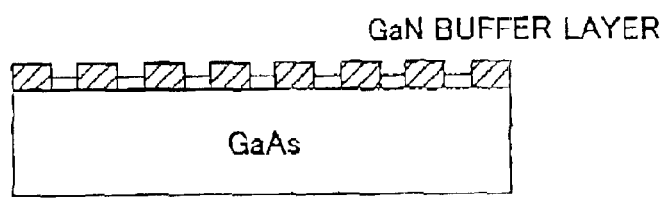
Figure 3C:
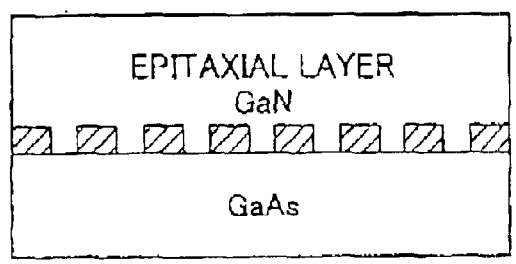
Figure 3D:
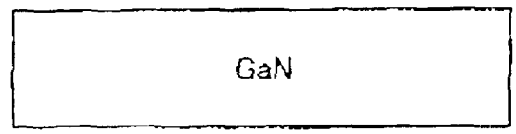
Figure 4A:
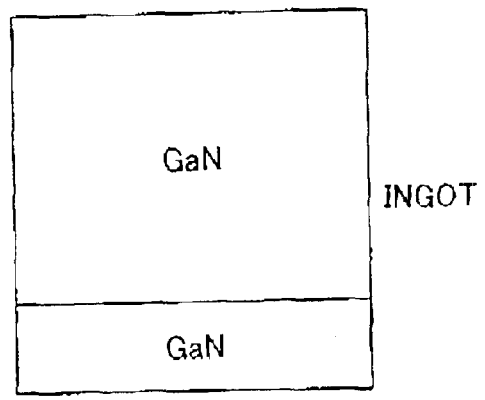
Figure 4B:
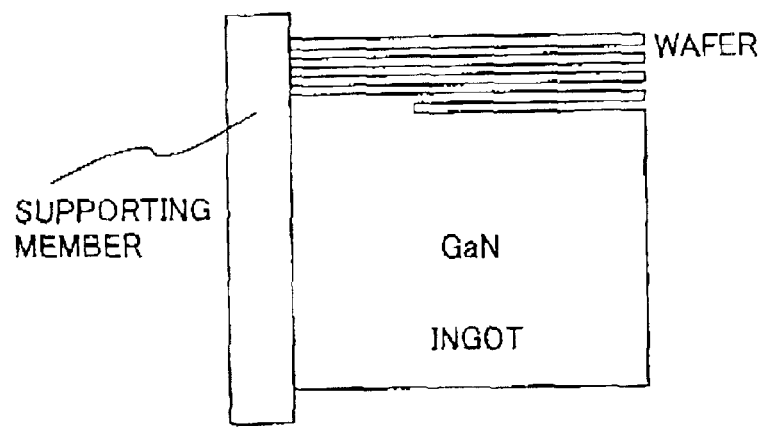
Figure 4C:
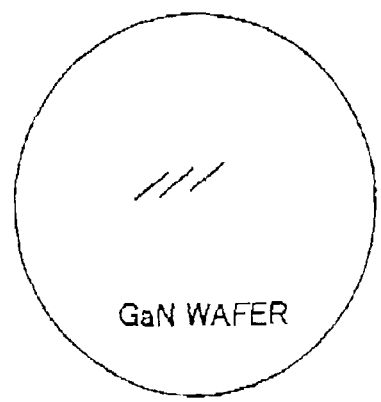

Since the group-III nitride crystal (GaN crystal) according to the present invention is used in this semiconductor laser as the substrate 601, there are few crystal defects in the semiconductor laser device, and it provides a large power output and has a long life. Moreover, since the GaN substrate 301 is of n type, an electrode 610 can be formed directly onto the substrate 601, thus does not need to draw two electrodes of p side and n side only from the obverse surface as in the prior art shown in FIG. 1, and, thus, cost reduction can be achieved.

Furthermore, in the semiconductor device shown in FIG. 10, it becomes possible to form a light emitting end surface by cleavage, also, chip separation can be performed by cleavage. Thus, it is possible to achieve a high-quality semiconductor device at low cost.

In addition, although InGaN MQW is used as the activity layer 604 in the above-mentioned example shown in FIG. 10, it is also possible to shorten the wavelength of light emitted by using AlGaN MQW as the activity layer, instead. According to the present invention, light emission from a deep level is reduced as the GaN substrate 601 thus has few defects and few impurities. Accordingly, it is possible to thus provide a light-emission device having a high efficiency even when the wavelength of the light emitted is shortened.

Moreover, although each of the above-mentioned embodiments (also will be described below) is an application of the present invention to an optical device, the present invention may also be applied to an electronic device. That is, by using a GaN substrate with few defects according to the present invention, a GaN-family thin film formed thereon by epitaxial growth also has few crystal defects. Consequently, the leak current can be well controlled, and a career confining effect when a quantum structure is made can be improved, for example. Thus, a high-performance device can be achieved according to the present invention.

That is, a group-III nitride crystal according to the present invention has effectively reduced crystal defects, as mentioned above. Accordingly, a high-performance device is realizable by performing device production from thin film growth using this group-III nitride crystal, by producing the device therefrom or utilizing it as a substrate for the device. The above-mentioned high-performance device means a device having a hihg output rate or a long life in comprson to the prior art in case the device is of a semiconductor laser or a light-emission diode. On the other hand, the same means a device requiring a reduced power supply rate, having a low noise rate, able to run at high speed, and/or able to operate at a high temperature environment in case the device is of an electronic device. The same means a device with a reduced noise rate, a long life, and so forth.

In each of the above-described embodiments, a material containing nitrogen at least (for example, nitrogen gas, ammonia gas, or sodium azide) is supplied to the reaction vessel 101. However, it is also possible to supply to the reaction vessel not only a gas of material containing nitrogen at least (for example, nitrogen gas, ammonia gas, or sodium azide) but also an inactive gas (for example, argon gas) as a mixed gas.

The above-mentioned inactive gas means a material which reacts with none of the above-mentioned alkaline metal, the above-mentioned material which contains group-III metal at least and the above-mentioned material which contains nitrogen at least in the reaction vessel 101.

Although in such a case where a mixed gas of a material containing nitrogen at least and an inactive gas is supplied, the pressure required for growth of a group-III nitride crystal is determined by the effective pressure of the nitrogen in the reaction vessel not the total pressure of the mixed gas.

In such a scheme in which the mixed gas of the material containing nitrogen at least and the inactive gas is supplied, it is possible to effectively prevent evaporation of the alkaline metal, while continuous stable supply of the group-V material can also be achieved. Fifteenth, sixteenth and seventeenth embodiments of the present invention which will now be described are those applying this scheme.

Figure 11:
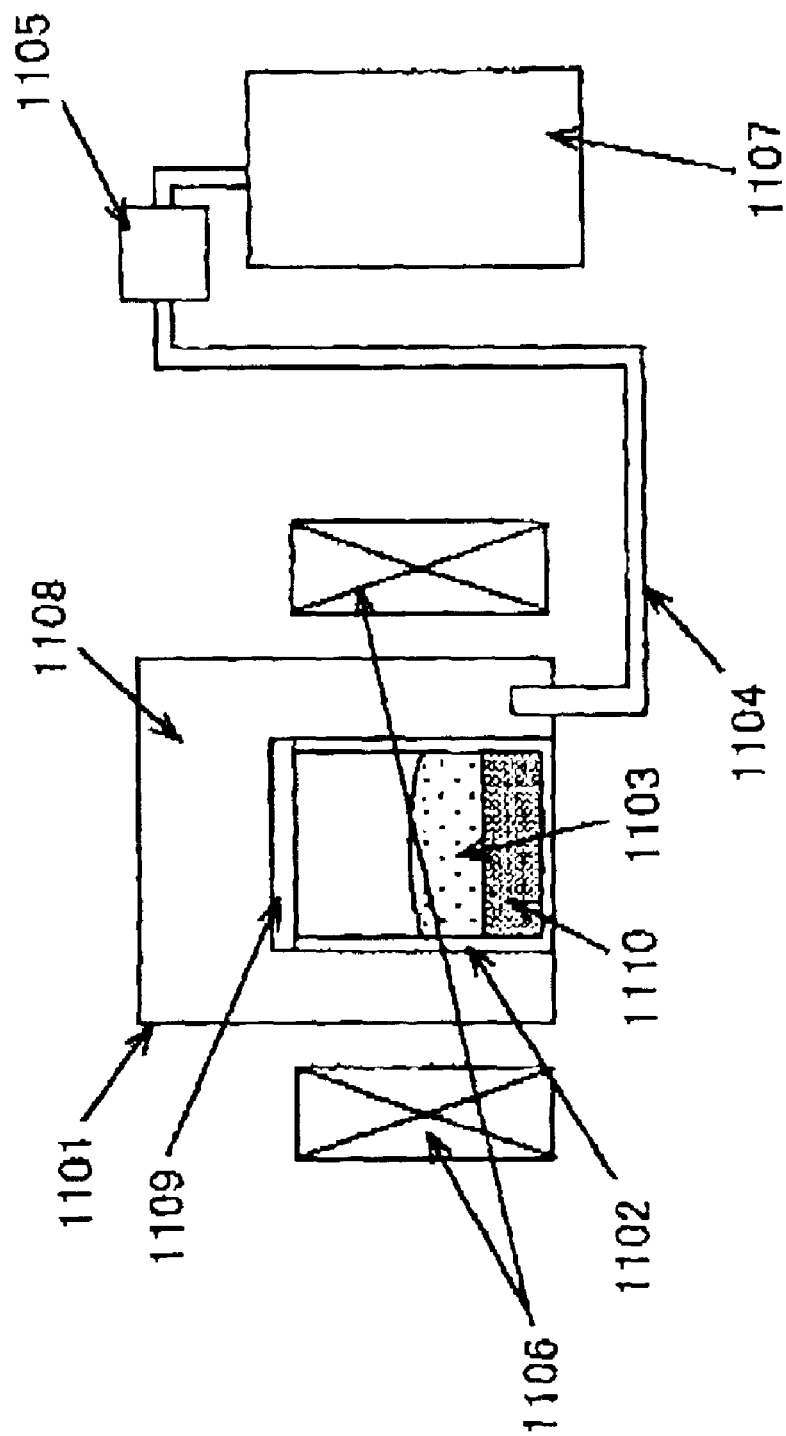
FIG. 11 shows a side-elevational sectional view of a crystal growth apparatus in a fifteenth embodiment of the present invention.

FIG. 11 illustrates a general configuration of a group-III nitride crystal growing apparatus according to the fifteenth embodiment of the present invention.

As shown in the figure, a mixed molten liquid container 1102 holding a mixed molten liquid 1103 of an alkaline metal (for example, Na) and a material which contains a group-III metal (for example, Ga) at least is provided in a reaction vessel 1101.

The alkaline metal (for example, Na) may be supplied from the outside, or may exist in the reaction vessel 1101 beforehand.

Moreover, a lid 1109 is provided on the mixed molten liquid container 1102, and a slight gap is provided between this mixed molten liquid container 1102 and lid 1109 such that a gas can communicate therethrough.

Moreover, the reaction vessel 1101 is formed by stainless steel. Moreover, the mixed molten liquid container 1102 is formed by BN (boron nitride), AlN, or pyrolytic BN.

Moreover, a heating device 1106 for controlling the inside temperature of the reaction vessel 1101 to a temperature such that crystal growth of a group-III nitride (for example GaN) may occur is formed in the reaction vessel 1101. That is, by the temperature control function of the heating device 1106, it is possible to raise the inside temperature of the reaction vessel 1101 to the temperature in which crystal growth may occur, to lower the same into a temperature such that no crystal growth occurs, or to maintain either state for an arbitrary time interval.

Moreover, a supply pipe 1104 is provided by which a mixed gas of the material which contains nitrogen (for example, nitrogen gas, ammonia gas, or sodium azide) and the inactive gas (for example, argon gas) is supplied into the reaction vessel 1101, in the group-III nitride crystal growing apparatus of FIG. 11.

Moreover, a pressure adjustment mechanism 1105 is provided in order to adjust the pressure of the mixed gas in the supply pipe 1104. In addition, this pressure adjustment mechanism 1105 includes a pressure sensor, a pressure regulator valve, etc.

Moreover, the mixed gas is held by a mixed gas container 1107 as a compressed gas.

In this embodiment, an argon gas is used as the inactive gas, and a nitrogen gas is used as the material which contains nitrogen at least. According to the fifteenth embodiment, the gas supply pipe 1104 supplies the mixed gas of nitrogen gas and argon gas into the space 1108 in the reaction vessel 1101 from the outside. The mixed gas is thus supplied from the bottom of the reaction vessel 1101 as shown in FIG. 11. The pressure adjustment mechanism 105 can adjust the pressure of this mixed gas at this time.

This mixed gas is held by the mixed gas container 1107 as a compressed gas. For example, the total pressure of the mixed gas in this mixed gas container 1107 is 120 atms. Thereof, the pressure of nitrogen is 60 atms while the pressure of the argon gas is also 60 atms, for example.

By the pressure adjustment mechanism 1105, then, the total pressure of the mixed gas in the reaction vessel 1101 is controlled into 100 atms, for example. The partial pressures in the reaction vessel 1101 at this time are those of 50 atms for the nitrogen gas and of 50 atms for the argon gas. In this state, the temperature inside of the reaction vessel 1101 is raised into the temperature of 750 degrees C. at which crystal growth may occur. By maintaining for a fixed time this growth condition, a GaN crystal 1110 which is a group-III nitride grows in the mixed molten liquid container 1102. At this time, the GaN crystal grows, and the thus-consumed nitrogen in the reaction vessel 1101 is supplemented from the mixed gas container 1107 through the supply pipe 1104 in a state of nitrogen gas.

Since the total pressure of the mixed gas of the argon gas and nitrogen gas is 100 atms as mentioned above, evaporation of Na in the mixed molten liquid container 102 is controlled, and thus, the molten liquid is well maintained in its constituent ratio. Consequently, the ratio in amount between Ga and Na in the mixed molten liquid can be thus controlled, and, thus, a GaN crystal in high crystal quality can be made to grow there continuously.

Figure 12:
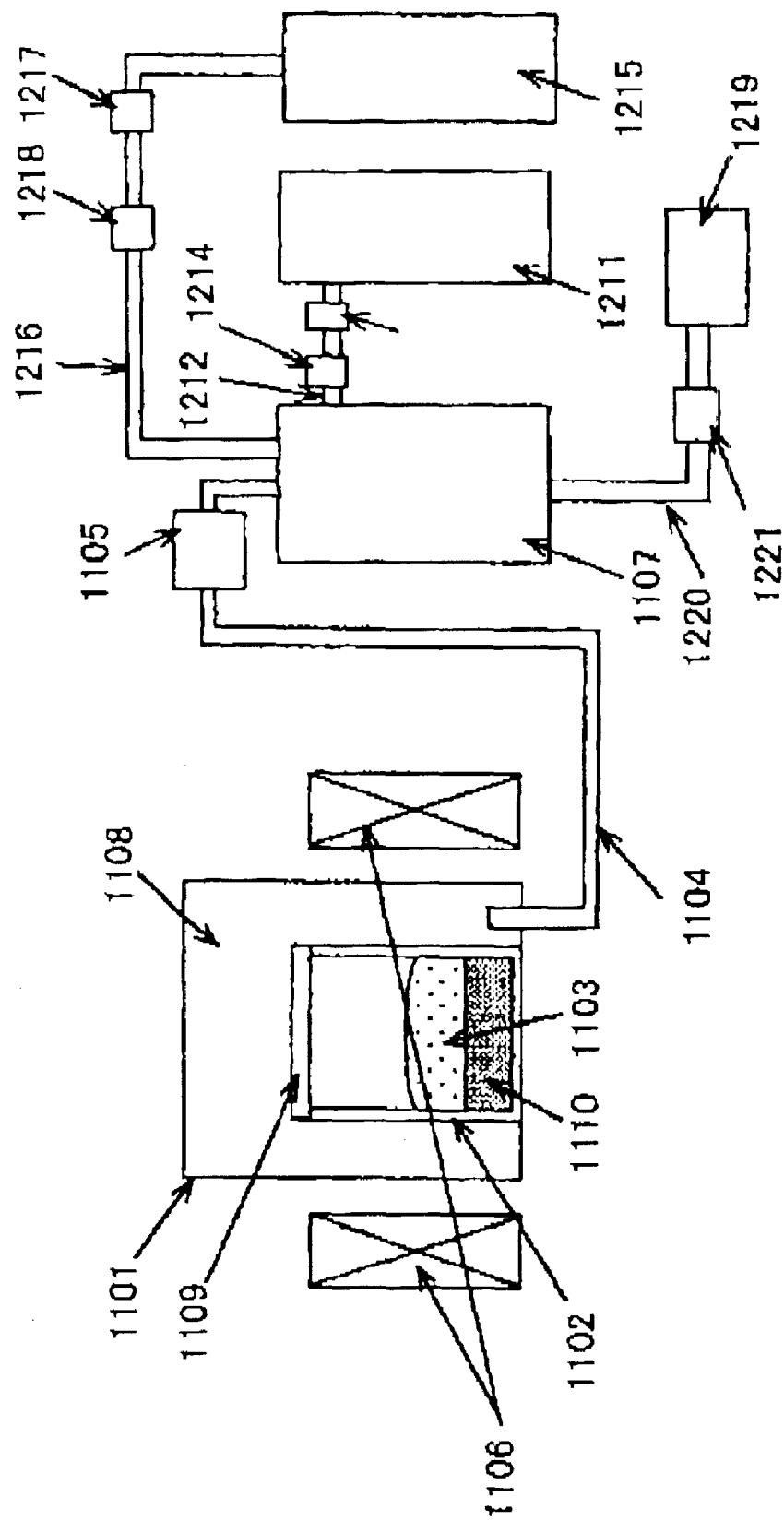
FIG. 12 shows a side-elevational sectional view of a crystal growth apparatus in a sixteenth embodiment of the present invention.

FIG. 12 illustrates an example of a configuration of a group-III nitride crystal growing apparatus in the sixteenth embodiment of the present invention.

As shown in FIG. 12, the sixteenth embodiment is different from the above-described fifteenth embodiment only in a point as will now be described. That is, from the comparison between FIGS. 11 and 12, on and around the reaction vessel 1101 and the mixed gas container 1107, both the embodiments have the same configuration. However, the sixteenth embodiment is different from the fifteenth embodiment in that a nitrogen gas container 1211 and an argon gas container 1215 are provided in the outside of the mixed gas container 1107.

Thus, the nitrogen gas container 1211 and the argon gas container 1215 are provided separately from the mixed gas container 1107. The nitrogen gas container 1211 is connected to the mixed gas container 1107 by a nitrogen gas supply pipe 1212, and thereby, a nitrogen gas can be supplied from the nitrogen gas container 1211 into the mixed gas container 1107. Moreover, in the nitrogen gas supply pipe 1212, a first pressure regulator 1213 and a first valve 1214 are provided, and, thereby, it is possible to control the nitrogen pressure in the mixed gas container 1107 supplied from the nitrogen gas container 1211.

Similarly, the argon gas container 1215 is also connected to the mixed gas container 1107 through an argon gas supply pipe 1216. Furthermore, a second pressure regulator 1217 and a second valve 1218 are provided in the argon gas supply pipe 1216. Thereby, the pressure of the argon gas is controlled, and the thus-pressure-controlled argon gas is supplied to the mixed gas container 1107.

Moreover, in order to make the mixed gas container 1107 into a vacuum state so as to purge the atmosphere in the same container, a vacuum pump 1219 is provided in the outside of the mixed gas container 1107. The mixed gas container 1107 and the vacuum pump 1219 are connected together via an exhaust pipe 1220, and thereby, it is possible to exhaust the inside air of the mixed gas container 107 so as to make the container enter a vacuum state. Moreover, an exhaust valve 1221 is provided in the exhaust pipe 1220 between the mixed gas containers 1107 and the vacuum pump 1219.

Operation in the crystal growth apparatus sixteenth embodiment is basically the same as in the fifteenth embodiment.

However, a different point from the way in the sixth embodiment is a manner of supplying the mixed gas of the nitrogen gas and argon gas into the mixed gas container 1107. The method of supply of the mixed gas to the mixed gas container 1107 according to the sixteenth embodiment will now be described.

First, the atmosphere in the mixed gas container 1107 is exhausted by using the vacuum pump 1219. At this time, the exhaust valve 1221 is set in an open state, and the air in the mixed gas container 1107 is exhausted through the exhaust pipe 1220. At this time, the first valve 1214 and the second valve 1218 are both closed, and thus, only the air in the mixed gas container 107 is positively exhausted. After the air in the mixed gas container 1107 is exhausted so as to achieve a vacuum state of the container, the exhaust valve 1221 is closed, and thus, the vacuum state in the mixed gas container 1107 is maintained.

Next, the first valve 1214 is opened and the mixed gas container 1107 is filled up with the nitrogen gas supplied from the nitrogen gas container 1211. At this time, the pressure of the nitrogen gas is set as a predetermined pressure using the first pressure regulator 1213. In this case, for example, the pressure of the nitrogen gas is set as 30 atms. After filling up the mixed gas container 1107 with the predetermined pressure with the nitrogen gas, the first valve 1214 is closed. The mixed gas container 1107 is filled up only with the nitrogen gas in the pressure of 30 atms in this state.

Next, the mixed gas container 1107 is supplied with the argon gas from the argon gas container 1215. At this time, in a state in which the setting pressure of the second pressure regulator 1217 is made into 100 atms, the second valve 1218 is opened. As a result, since the mixed gas container has been filled up with the 30 atms in pressure with the nitrogen gas until then as mentioned above, the argon gas comes to have 70 atms in pressure in the mixed gas container 1107. The second valve 1218 is closed after the argon gas is thus provided into the mixed gas container 1107. At this time, the mixed gas container 1107 has 100 atms in pressure in total, in which 30 atms in pressure of the nitrogen gas and 70 atms in pressure of the argon gas are filled up with.

The crystal growth process performed after the mixed gas container 1107 is thus filled up with the mixed gas is the same as that in the above-mentioned fifteenth embodiment.

The feature of the sixteenth embodiment is that it is possible to control the mixed gas in the total pressure and, also in partial pressures for the respective gases on the other hand, arbitrarily. Thereby, it becomes possible to set the nitrogen pressure which serves as a parameter of the crystal growth conditions as an arbitrary pressure, and, also, to effectively reduce the evaporation of Na which is the alkaline metal at the same time by providing a sufficiently high total pressure applied to the mixed molten liquid. That is, it becomes possible to prepare the mixed gas with an arbitrary nitrogen pressure and also an arbitrary argon pressure.

Figure 13:
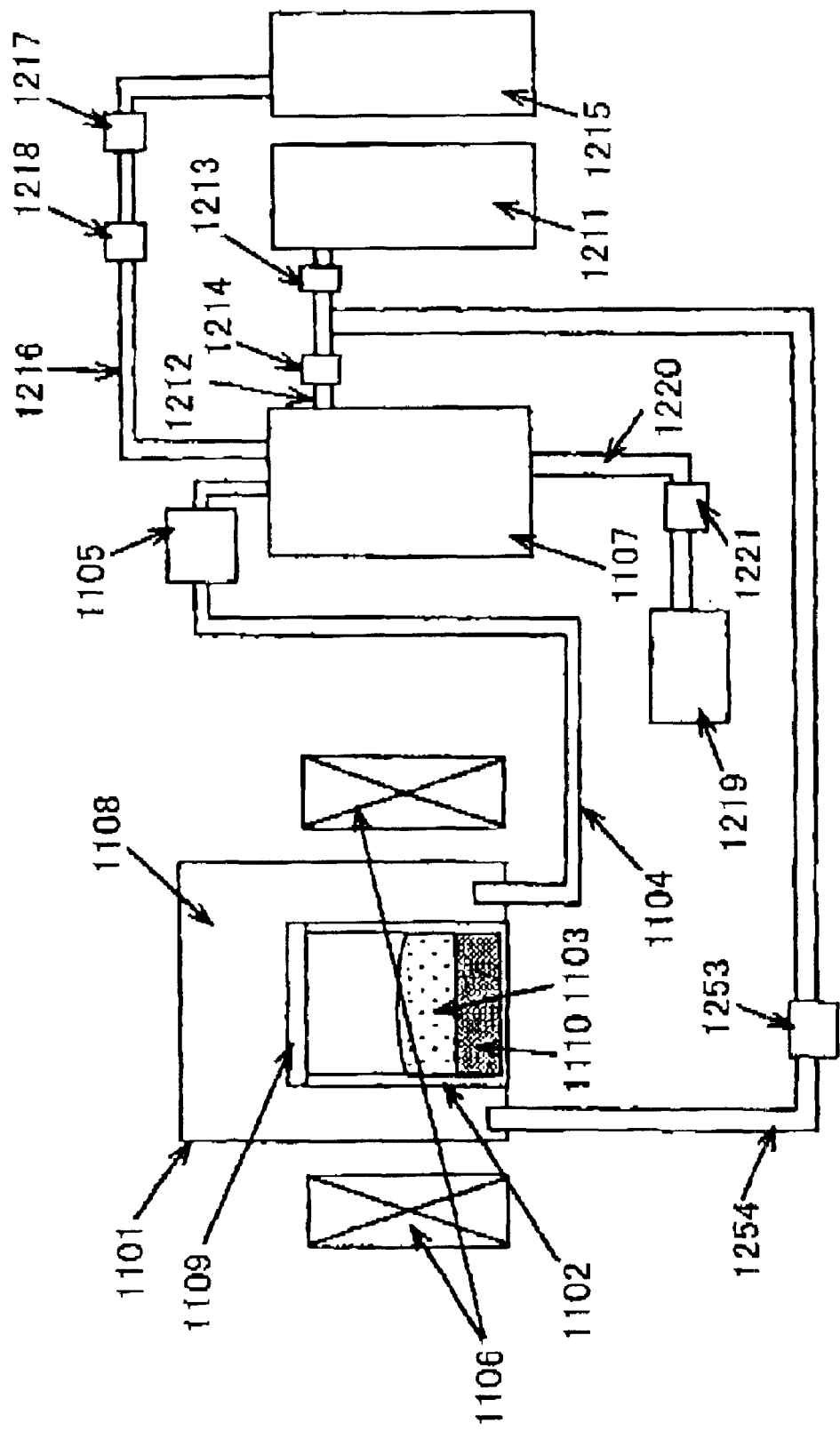
FIG. 13 shows a side-elevational sectional view of a crystal growth apparatus in a seventeenth embodiment of the present invention.

FIG. 13 illustrates an example of configuration of a group-III nitride crystal growing apparatus according to the seventeenth embodiment of the present invention.

As shown in the figure, the seventeenth embodiment is different from the above-described sixteenth embodiment only by the following features. Namely, as shown in FIG. 13, a second nitrogen gas supply pipe 1254 extends from the nitrogen gas supply pipe 1212 connecting between the nitrogen gas container 1211 and the mixed gas container 1107. By this second nitrogen gas supply pipe 1254, the nitrogen gas supply pipe 1212 and the reaction vessel 2101 are directly connected together. Specifically, the second nitrogen gas supply pipe 1254 is branched from the nitrogen gas supply pipe 1212 between the first pressure regulator 1213 and the first valve 1214, and a third valve 1253 is provided between the reaction vessel 2101 and the nitrogen gas supply pipe 1212 as shown.

A crystal growth process performed in the crystal growth apparatus in the seventeenth embodiment is basically same as in above-described fifteenth and sixteenth embodiments. Also, a process of filling up the nitrogen gas and argon gas into the mixed gas container 1107 is basically same as in the sixteenth embodiment. A different point is to perform a supplemental gas supply from the outside during a process of crystal growth after filling up the reaction vessel 1101 with the mixed gas of nitrogen gas and argon gas. That is, the process performed before starting the crystal growth is same as in the sixteenth embodiment. The process of supplemental gas supply from the outside during the process of crystal growth after filling up of the mixed gas of nitrogen gas and argon gas into the reaction vessel 1101 will now be described.

First, after filling up the reaction vessel 1101 with the mixed gas of nitrogen gas and argon gas, the communication between the mixed gas container 1107 and the reaction vessels 1101 is shut off. At this time, the third valve 1253 is closed until the reaction vessel 1101 is thus filled with the mixed gas. Then, with the first valve 1214 closed, the third valve 1253 is opened, and, thereby, nitrogen gas is supplied from the nitrogen gas container 1211 to the reaction vessel 1101 directly. At this time, the supply pressure of the nitrogen gas is controlled by means of the first pressure regulator 1213 into a pressure same as the pressure (100 atms, in this case) of the mixed gas filled up with in the reaction vessel 1101 beforehand.

In this state, as in the fifteenth embodiment described above, the temperature in the reaction vessel 1101 is raised and thus crystal growth is made to start. Here, a different point from the fifteenth and sixteenth embodiments is in the supply pressure of the nitrogen gas used for compensating the nitrogen gas consumed in the reaction vessel 1101. That is, according to the fifteenth embodiment or the sixteenth embodiment, lowering in pressure of the nitrogen gas due to being consumed with the GaN crystal growth should be compensated by means of supply of the mixed gas. Accordingly, the partial pressure of nitrogen gas inevitably falls as the mixed gas is thus supplied for the compensation purpose. Consequently, it is not possible to keep the partial pressure of the nitrogen gas constant at a high accuracy.

In contrast thereto, according to the seventeenth embodiment described above, the reaction vessel 1101 has the mixed gas filled up with at the beginning of crystal growth, and, then, after the beginning of crystal growth, only nitrogen gas is supplied in compensation for the material consumption by crystal growth. Thereby, it is possible to avoid lowering in the nitrogen partial pressure in the reaction vessel 1101 during crystal growth. Consequently, it is possible to proceed with the crystal growth with maintaining the partial pressure of the argon gas used as the inactive gas, and also the partial pressure of the nitrogen gas used as the nitrogen material constantly.

Therefore, according to the seventeenth embodiment, in addition to the features of the fifteenth embodiment and sixteenth embodiment, by maintaining the constant nitrogen pressure, stability in crystal growth conditions can be further improved. Thereby, it is possible to make further high-quality GaN crystal with effectively reduced nitrogen deficits.

Thus, by the group-III nitride crystal growing apparatus according to the above-described fifteenth through seventeenth embodiments, in the reaction vessel, the alkaline metal and the material which contains the group-III metal at least form the mixed molten liquid. Then, when carrying out crystal growth of the group-III nitride which includes the group-III metal and nitrogen from this mixed molten liquid and the material which contains nitrogen at least respectively, stable continuous supply of the group-V material is attained by providing the gas atmosphere in the reaction vessel with the mixed gas of the material which contain nitrogen at least and the inactive gas, and also, effectively avoiding evaporation of the alkaline metal.

This scheme is advantageous in comparison to the way of using only a nitrogen gas without using an argon gas as inactive gas, in that it is possible to raise the controllability in the amount of supply of the nitrogen material. That is, total pressure in the reaction vessel affects the evaporation speed of the alkaline metal, and it becomes possible to reduce the evaporation speed of the alkaline metal accordingly by raising the total pressure. Furthermore, the pressure of the material which contains nitrogen at least affects the nitrogen solubility into the inside of the mixed molten liquid. The nitrogen solubility into the mixed molten liquid can be made to increase as the pressure of the material which contains the nitrogen at least is increased. However, according to the preferable crystal growth conditions, there is the proper range of the pressure of the nitrogen gas. In this regard, the pressure of the material which contains the nitrogen at least should be preferably controllable independently into the above-mentioned proper range, also with controlling the evaporation of the alkaline metal, by employing the inactive gas to be mixed with the nitrogen material gas. Thereby, crystal growth with improved controllability can be attained.

Thus, according to this aspect of the present invention, as the atmosphere in the reaction vessel is formed of the mixed gas of the material at least including nitrogen and the inactive gas, it becomes possible to achieve continuous grow of a group-III nitride crystal with maintaining the ratio in amount between the alkaline metal and group-III metal at a constant value. Thereby, it becomes possible to make growing up of a quality group-III nitride crystal with effectively reduced defective density.

According to the sixteenth and seventeenth embodiments, the pressure of the material at least including nitrogen and the pressure of the inactive gas are controlled independently. Thereby, it becomes possible to further raise the controllability in crystal growth conditions, thus, to achieve stable crystal growth conditions, and, as a result, to yield a quality group-III nitride crystal with further reduced defective density.

Moreover, by mixing the material including nitrogen and inactive gas with the predetermined pressure ratio well controlled beforehand, and then, supplying the thus-obtained mixed gas into the reaction vessel, it becomes possible to achieve the crystal growing apparatus at a reduced cost. That is, as the mixed gas can be supplied by means of a simple configuration, it becomes possible to simplify the total configuration of the crystal growing apparatus serves.

Moreover, according to the seventeenth embodiment, since the material which contains nitrogen at least can be continuously supplied to the reaction vessel, the crystal growing apparatus has the controllability still higher in the crystal growth conditions. That is, as the material which contains nitrogen at least can be continuously supplied to the reaction vessel, the controllability in the crystal growth conditions is raised and it becomes possible to realize a quality group-III nitride crystal with well reduced nitrogen deficits.

Also a group-III nitride crystal yielded by means of any of the above-described fifteenth through seventeenth embodiments may be utilized for providing a semiconductor device in the same manner as that describe above with reference to FIG. 10. Then, by the same reasons, a high-performance semiconductor device can be produced also in this case.

Eighteenth through twenty-first embodiments of the present invention will now be described. These embodiments are further aimed at improvements in group-III nitride crystal growth methods, which may be applied either solely or together in combination with any features described above on the first through seventeenth embodiments. Before making description, supplemental description on the related art will now be made first.

As to a blue LED, luminosity is small in comparison to a red or green LED, and, thus, it has been difficult to put it into a practical use. However, in a group-III nitride compound semiconductor expressed by a general formula of InAlGaN, in recent years, by applying a low-temperature AlN buffer layer or a low-temperature GaN buffer layer, crystal growth technology is improved. Furthermore, a low-resistance p-type semiconductor layer employing Mg as a dopant can be obtained. Thereby, a high-luminosity blue LED can be put into a practical use and a semiconductor laser oscillated in a blue wavelength zone is thus realized.

Generally, when carrying out epitaxial growth of a quality semiconductor layer on a substrate, a lattice constant and a heat expansion coefficient of the substrate and the semiconductor layer need to be of the same order. However, no substrate can be obtained in a group-III nitride semiconductor which simultaneously satisfies these requirements.

Therefore, when applying a group-III nitride, generally, a thick-film GaN is made to grow on a substrate having a different type from a group-III nitride semiconductor such as a sapphire, GaAs or the like by employing a crystal growth technology such as ELO. Then, by utilizing the thus-obtained crystal as a substrate, a semiconductor laser crystal is produced thereon.

However, the thick-film GaN substrate obtained through the crystal growth employing the substrate having the different type has a large amount of crystal defect on the order of $10^7$ cm$^{-2}$ of dislocation density. Accordingly, it may be difficult to put it into a practical use for producing a high-power laser device, an electronic device, or the like.

Moreover, the thick-film GaN substrate obtained through crystal growth employing the substrate of different type is one obtained through crystal growth made dependent on the surface orientation of the different-type substrate. Accordingly, the main surface thereof is determined by the surface orientation of the different-type substrate. As only (0001) C-plane sapphire and (111) GaAs are available as the different-type substrates on which a thick-film GaN can be made to grow, the main surface thereof is limited only to (0001) C-plane.

However, chip cutting of LED or LD produced on the GaN substrate having the C-plane as the main surface thereof cannot provide strips thereof easily. Usually, in a substrate having the C-plane as the main surface, m-plane and a-plane cross perpendicularly to one another. Then, chip cutting is performed along the a-plane. However, another m-plane occurs which cross the a-plane by the angel of 30 degrees. Accordingly, a cleavage occurs in this plane, and, thus, chip cutting into strips may not be achieved easily.

On the other hand, on a substrate having an m-plane as the main plane, easy cleavage plane is only a C-plane and an a-plane both crossing perpendicularly. Similarly, on a substrate having an a-plane as the main plane, easy cleavage plane is only a C-plane and an m-plane both crossing perpendicularly. Accordingly, chip-cutting into strips can be achieved easily.

Moreover, a manner of change in hand structure occurring when a distortion is applied is different between a crystal grown on a C-plane and a crystal grown on another plane. Accordingly, improvement in device performance or realization of a device which functions depending on the surface orientation of the substrate are expected, by utilization of a plane other than a C-plane. For example, as an improvement in the device performance, a study for lowering the threshold in a laser is proceeded with by means of a computer simulation method. However, a thick-film GaN substrate, which has a plane other than a C-lane as the main surface thereof could not be obtained practically, and, thus, such an improvement could not be expected actually.

On the other hand, trials have been made by various research organizations for producing GaN single bulk crystal to be used for producing high-quality bulk GaN substrates. However, as described above, merely several millimeters thereof can be achieved, and, thus, nothing which can be provided for actual utilization could be achieved yet. In fact, according to the above-described fourth prior art, a GaN crystal as large as on the order of 1 millimeter is obtained.

Figure 14:
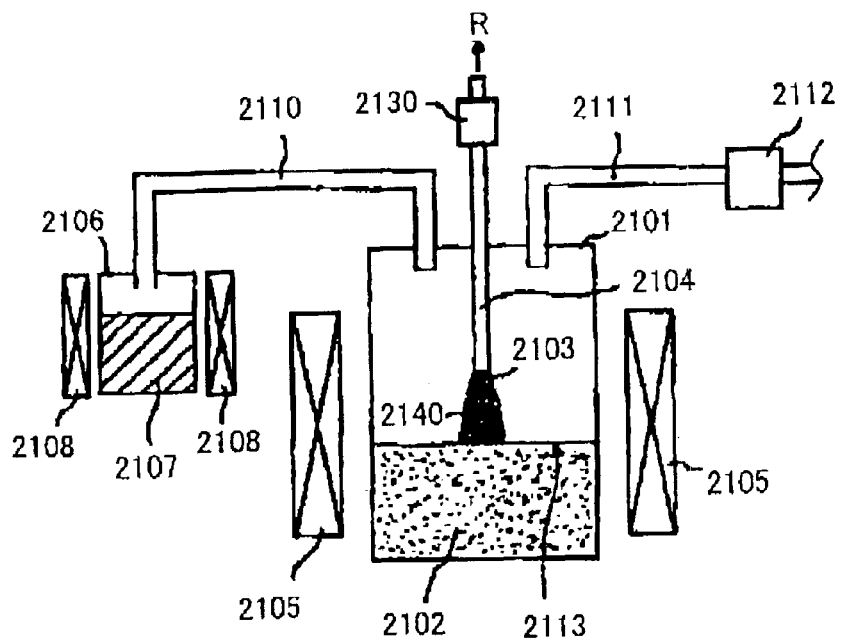
FIGS. 14 and 15 illustrate other prior arts.
Figure 15:
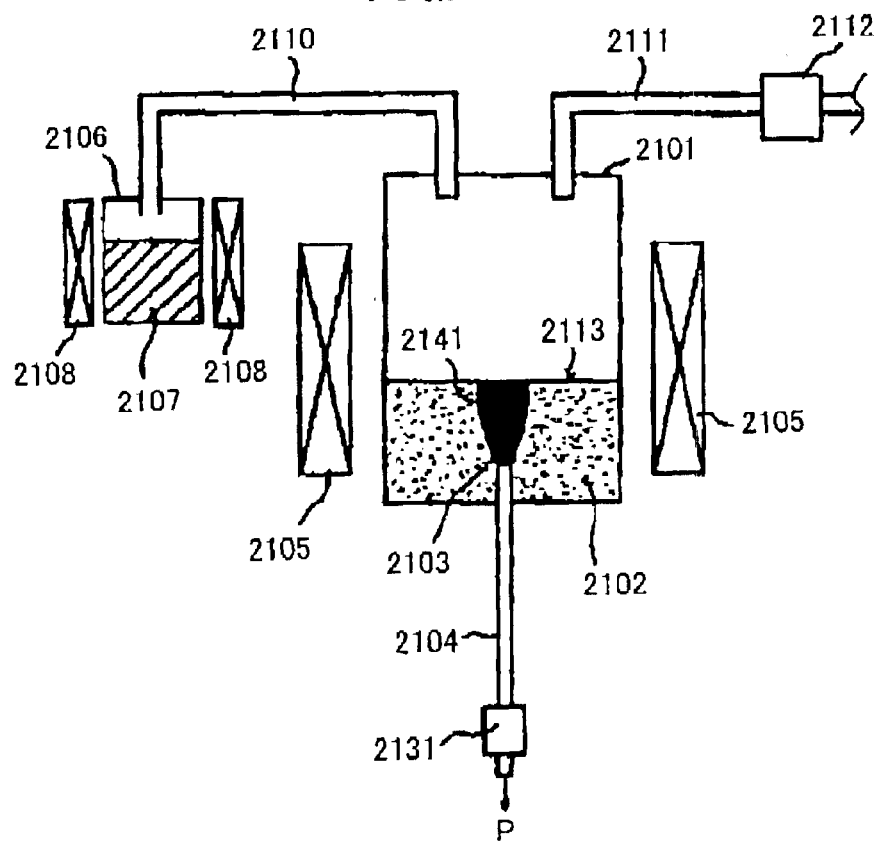

In the above-mentioned Japanese laid-open patent application No. 2001-64098 (seventh prior art), as shown in FIGS. 14 and 15, a method of moving a seed crystal to a surface of a flux molten liquid, or a method of immersing a seed crystal into a flux molten liquid, in a process of a group-III crystal growth are proposed.

In the method of pulling up a crystal, as shown in FIG. 14, a crystal growth is made to start in a mixed molten liquid 2102 of a flux and a group-III metal by using a seed crystal. Then, the seed crystal is moved upward, and, then crystal growth is made to occur in the interface between the air and liquid 2113. After that, a thus-yielded ingot of group-III nitride crystal is pulled up.

In the method of immersing a seed crystal in a molten liquid, as shown in FIG. 15, a crystal growth is made to start from the seed crystal on a gas-to-liquid interface between the mixed molten liquid of a flux and a group-III metal, and a nitrogen material gas, and, then, the seed crystal 2103 is immersed into the molten liquid. Thereby, the crystal growth is made to continue on the gas-to-liquid interface 2113 by gradually moving the seed crystal. Thus, an ingot 2141 of the group-III nitride crystal is produced.

However in either case of FIG. 14 or 15, in order to control the steam pressure of the nitrogen material and flux, a predetermined steam pressures should be applied from the outside.

Moreover, the above-mentioned Japanese laid-open patent application No. 2001-64097 (eighth prior art) discloses to make a crystal growth with maintaining a seed crystal on a gas-to-liquid interface in a state in which a nitrogen material gas is supplied into a reaction vessel holding a mixed molten liquid of a flux (Na) and a group-III metal (Ga).

According to the above-described fourth prior art, the reaction vessel used is small, and the size of a crystal obtained is on the order of 1 mm, and thus, is too small for putting a device in practical use.

According to the seventh prior art, although an ingot of group-III nitride crystal can be yielded, as the nitrogen needs to melt into the molten liquid from the gaseous phase and needs to be spread on the crystal growth surface, the crystal growth rate depends on the rate of supply of the nitrogen. Therefore, it is necessary to pull up the seed crystal very slowly in several micrometers/hour so as to achieve production of a large ingot with a uniform property throughout the surface. Accordingly, a considerably long time is needed.

Moreover, in case of immersing a crystal so as to produce an ingot, as nitrogen is uniformly supplied to the growth surface from the gas-to-liquid interface, the ingot of an group-III nitride with the uniform property within a section parallel to the gas-to-liquid interface of an ingot. However, in order to immerse the crystal into the molten liquid in this case, there may be a case where other crystal nucleuses adhere to the relevant crystal in the molten liquid, and thus, a polycrystal occurs inevitably.

Moreover, by the method of growing up a crystal by holding a seed crystal according to the eighth prior art described above, a crystal grows in parallel with the gas-to-liquid interface, and the plate-shaped crystal which has the main surface parallel to the gas-to-liquid interface grows. Since supply of nitrogen is performed from the gas-to-liquid interface, the growth proceeds along the gas-to-liquid interface. However, in this case, after the crystal becomes to have a certain amount of size, the crystal sink into the molten liquid by its own weight, and, thus, it may be difficult to produce a large size of crystal actually.

The inventors of the present invention performed an experiment for confirming this method. That is, the experiment for growing up a large plate-shaped crystal using a mixed molten liquid of Na and Ga was conducted. Consequently, the plate-shaped crystal which had the C-plane as the main surface grew up in parallel to the gas-to-liquid interface. However, after this plate-shaped crystal became to have a size of around 5 mm, it sank into the molten liquid, and, as a result, the crystal growth speed had become slower.

Moreover, crystal nucleuses occurred on the side wall of the crystal growth container. Although some of these crystal nucleuses grew along the gas-to-liquid interface therefrom, they grew along a direction from the container side wall into the molten liquid surface, and, thus, it extended along the inclined direction. The reason therefor may be that the surface of the mixed molten liquid of Na and Ga to gradually falls with the progress of the crystal growth.

In fact, at a crystal growth temperature, since the steam pressure is high, Na evaporates during the growth, and thus, the fall of the gas-to-liquid interface (surface) takes place. Therefore, a growing point gradually falls according to the lowering of the gas-to-liquid interface, and, as a result, a crystal extending along an inclined direction may be yielded. Moreover, in case the falling speed of the gas-to-liquid interface (surface) is quicker than the crystal growth speed, the crystal growth is interrupted unexpectedly Therefore, according to the eighth prior art, a plate-shaped crystal having a large area may not be able to be made to grow easily.

The eighteenth through twenty-first embodiments of the present invention provide devices to solve the above mentioned problem on production of group-III nitride crystals, and are aimed at offering group-III nitride crystal growth methods of producing quality group-III nitride crystals with large areas.

In the eighteenth through the twenty-first embodiments of the present invention, a plate-shaped crystal is made to grow on a gas-to-liquid interface of a mixed molten liquid in a reaction vessel. Accordingly, it is preferable that the crystal growth conditions according to the zone D shown in FIG. 6 are set in which zone, as mentioned above, plate-shaped crystals may grow dominantly.

Figure 16:
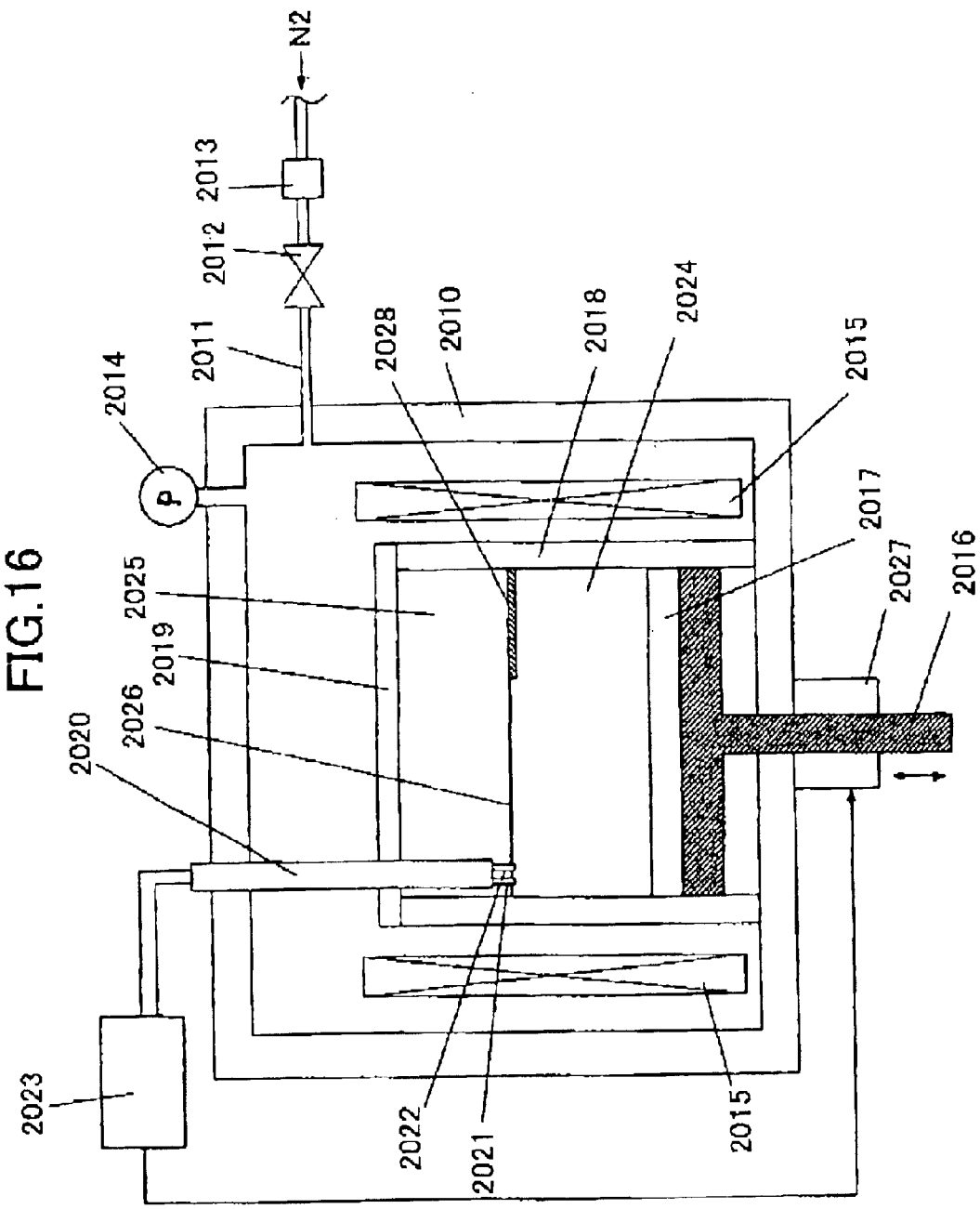
FIG. 16 shows a side-elevational sectional view of a crystal growth apparatus in an eighteenth embodiment of the present invention.

FIG. 16 illustrates an example of configuration of a group-III nitride crystal growth apparatus according to the eighteenth embodiment of the present invention. A reaction vessel 2010 made from stainless steel having a closed shape, a crystal growth container 2018 prepared in the reaction vessel 2010 for performing crystal growth therein, a sensor 2020 for detecting a surface (gas-to-liquid interface) 2026 of a molten liquid 2024, a bottom plate 2017 of the crystal growth container 2018, a lid 2019 of the crystal growth container 2018, and a moving jig 2016 for moving the bottom plate 2017 of the crystal growth container 2018 up and down, a jig moving device 2027 for driving the moving jig 2016, a control unit 2023 processing signals from the sensor 2020 and controlling the height of the moving jig 2016 so that the gas-to-liquid interface 2026 may be maintained at a fixed height, a heater 2015, and a pressure gauge 2014 serving as a monitor of the total pressure in the reaction vessel 2010, are provided in this crystal growing apparatus.

The material of the lid 2019 of the crystal growth container 2018, the bottom plate 2017, and the crystal growth container 2018 is BN (boron nitride).

Moreover, between the growth container 2018 and the lid 2019, a narrow gap is provided. A nitrogen material gas enters in the internal space 2025 of the crystal growth container 2018 through this gap, and forms the gas-to-liquid interface 2026 between the mixed molten liquid 2024 of an alkaline metal and a group-III metal.

Moreover, a gas supply pipe 2011 which makes it possible to make the internal space of the reaction vessel 2010 full of the nitrogen material gas, and to control the nitrogen material pressure in the reaction vessel 2010, passes through a side wall of the reaction vessel 2010. The gas supply pipe 2011 can be blocked from the exterior by a valve 2012. Moreover, it is possible to adjust the pressure of the nitrogen by a pressure regulator 2013.

The above-described crystal growth apparatus of FIG. 16 is configured so that the height of the molten liquid surface (gas-to-liquid interface) 2026 may be maintained at a fixed height. Specifically, two contacts 2021 and 2022 separate spatially are provided at an extending end of the sensor 2020. Then, according to existence/absence of an electric conduction therebetween, the bottom plate 2017 of the crystal growth container 2018 is stopped/moved upward. Thereby, the liquid surface (gas-to-liquid interface) 2026 can be controlled to be maintained at a predetermined height.

At the beginning of crystal growth, the contacts 2021 and 2022 are both in contact with the mixed molten liquid 2024 of the group-III metal and alkaline metal, thus an electric flow occurs between these contacts, and, thus, a signal which makes the jig moving device 2027 stop movement of the jig 2016 is sent from the control unit 2023. As a result, the jig 2016 is stopped.

On the other hand, when the surface (gas-to-liquid interface) 2026 of the mixed molten liquid 2024 falls as the crystal growth proceeds, and thus, the electric flow between the contacts 2021 and 2022 is lost, a signal which moves the jig 2016 is sent to the jig moving device 2027 from the control unit 2023, and the moving jig 2016 is driven upward. The bottom plate 2017 of the container 2018 is provided on the top of the moving jig 2016, and this bottom plate 2017 has a configuration such that it can move up/down in a state in which the circumferential part thereof is maintained in contact with the side wall of the container 2018 in a liquid-tight manner. Therefore, as the jig 2016 thus moves upward, the bottom plate 2017 also moves upward together with the jig 2016. Accordingly, the surface (gas-to-liquid interface) 2026 of the molten liquid 2024 also moves upward.

Then, when the molten liquid surface (gas-to-liquid interface) 2026 touches the contacts 2021 and 2022 accordingly, and they electrically continue with one another, the signal which makes the jig moving device 2027 stop the movement of the jig 2016 is then sent from the control unit 2023. Thereby, the jig 20161 stops moving. That is, the movement of the surface (gas-to-liquid interface) 2026 of molten liquid stops when the gas-to-liquid interface reaches the predetermined height.

Thus, in the apparatus of FIG. 16, the gas-to-liquid interface 2026 is always maintained at the height of the contacts 2020 and 2021. Thereby, along the gas-to-liquid interface 2026 thus maintained at the fixed height, growth of the group-III nitride crystal 2028 may continue, and the group-III nitride crystal 2028 of a large size and a plate shape parallel to the gas-to-liquid interface 2026 can be made to grow up positively.

A crystal growth process for GaN employing the crystal growth apparatus of FIG. 16 will now be described.

First, Na is put into the crystal growth container 2018 as the alkaline metal, and Ga is put into the same as the group-III metal, and then, the lid 2019 is put on the crystal growth container 2018.

The amounts of the alkaline metal and group-III metal thus put into the container 2018 are such that the height of the surface 2026 of the mixed molten liquid in the container 2018 after putting these metal materials into the container 2018 and causing them to melt there by heat become slightly lower than the height of the contacts 2021 and 2022 of the sensor 2020.

Subsequently, the reaction vessel 2010 is sealed, the valve 2012 is closed, and thus, the reaction vessel 2010 inside is isolated from the external atmosphere.

Subsequently, the temperature of the heater 2015 is increased into 700 degrees C.

Subsequently, the sensor 2020 is operated. At this time, since the contacts 2021 and 2022 of the sensor 2020 do not touch the mixed molten liquid 2024, the moving jig 2016 moves the bottom plate 2017 upwards. As a result, the surface 2026 goes up, the contacts 2021 and 2022 touch the surface 2026, and thus, the movement of the moving jig 2016 and the bottom plate 2017 stops.

Subsequently, the valve 2012 is opened, a nitrogen gas which is the nitrogen material gas is supplied from the gas supply pipe 2011, the pressure regulator 2013 adjusts the pressure of the nitrogen gas, and the total pressure in the reaction vessel 2010 is thus set to 5 MPa. Then, after this state is maintained for 200 hours, the temperature is lowered.

After also lowering the pressure of the gas in the reaction vessel 2010, in an actual experiment, by opening the reaction vessel 2010, it could be found out that a part of Na adhered to the lower part of the growth container 2018. Moreover, the bottom plate 2017 of the growth container 2018 was moved up, the molten liquid surface (gas-to-liquid interface) 2026 was in contact with the sensor 2020 and thus the surface (gas-to-liquid interface) 2026 was maintained at the fixed height during the crystal growth of GaN.

Further, it was also found out that a plate-shaped single crystal 2028 of GaN which was yielded from nuclear occurrence on the inner wall of the growth container 2018 grew in parallel to the gas-to-liquid interface 2026.

Thus, in the crystal growth apparatus of FIG. 16 according to the eighteenth embodiment of the present invention, since the gas-to-liquid interface 2026 is maintained at the fixed height while the crystal growth proceeds, a crystal which grows from nuclear occurrence at a position at which the wall of the growth container and the gas-to-liquid interface cross together is prevented from growing obliquely according to lowering of the gas-to-liquid interface, or from stopping unexpectedly. Thus, according to the eighteenth embodiment, along the gas-to-liquid interface at the fixed height, crystal growth of group-III nitride can always continue, and a plate-shaped group-III nitride crystal of a large size spreading in parallel to the gas-to-liquid interface is yielded.

Figure 17:
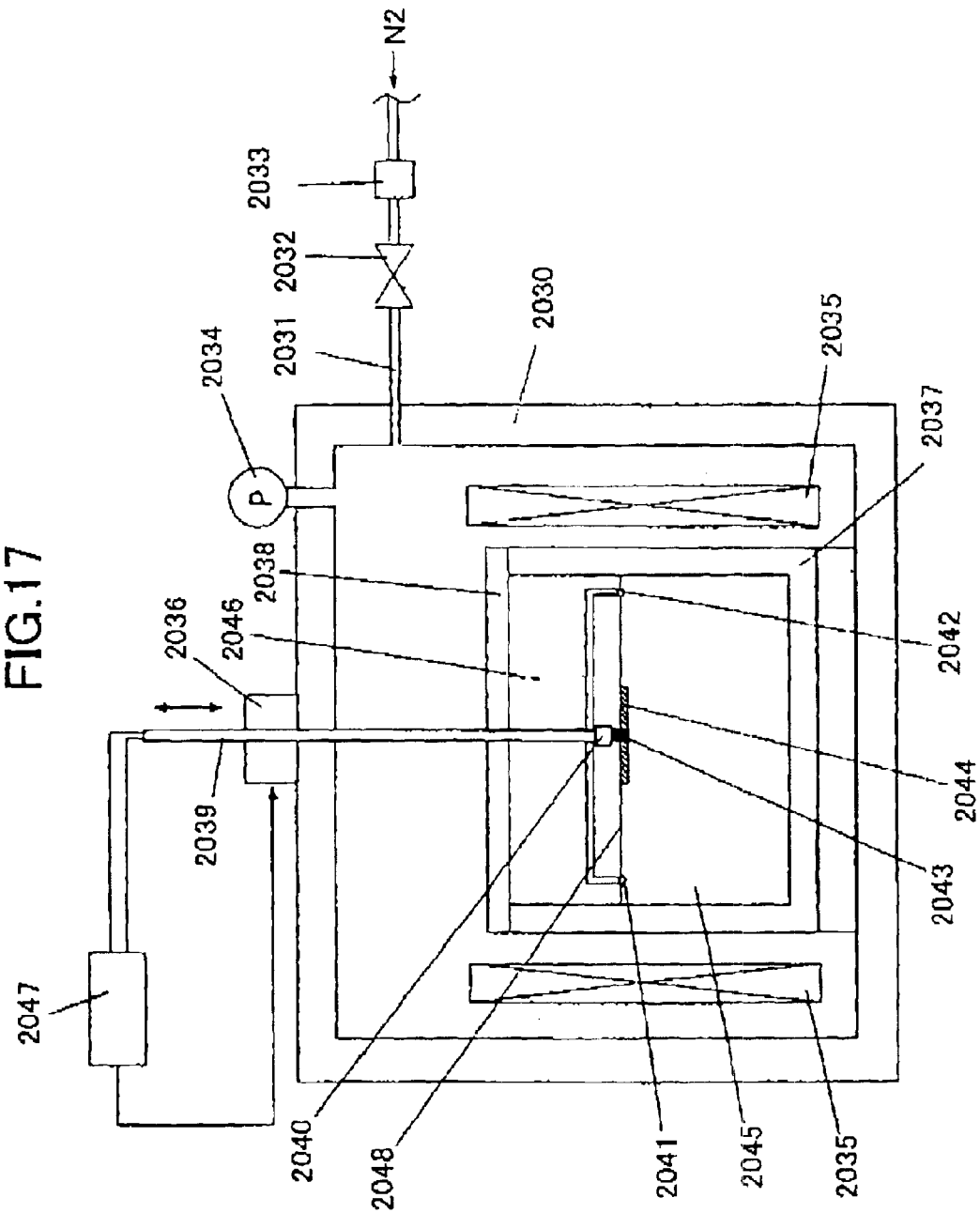
FIG. 17 shows a side-elevational sectional view of a crystal growth apparatus in a nineteenth embodiment of the present invention.

FIG. 17 illustrates an example of configuration of a group-III nitride crystal growth apparatus according to the nineteenth embodiment of the present invention. As shown in FIG. 17, a reaction vessel 2030 made of stainless steel having a closed shape, a crystal growth container 2037 provided in the reaction vessel 2030 and performing crystal growth therein, a lid 2038 of the crystal growth container 2037, and a moving jig 2039 for moving a crystal up and down are provided in this crystal growth apparatus.

The material of the lid 2038 of both the crystal growth container 2037 and the crystal growth container 2037 is BN (boron nitride).

Between the growth container 2037 and the lid 2038, a narrow gap is provided. A nitrogen material gas enters into an internal space 2046 of the crystal growth container 2037 through this gap, and forms a gas-to-liquid interface 2048 with a mixed molten liquid 2045 of an alkaline metal and a group-III metal.

Further, the moving jig 2039 for moving a crystal up and down is provided with sensor contacts 2041 and 2042 which detect the molten liquid surface (gas-to-liquid interface) 2048, and with a seed crystal holder 2040 which holds a seed crystal 2043.

Furthermore, a jig moving device 2036 for moving the moving jig 2039 is provided in the crystal growth apparatus of FIG. 17, also, a control unit 2047 is provided there which processes a signal from the sensor contacts 2041 and 2042, and controls movement of the moving jig 2039. Further, a heater 2035, and a pressure gauge 2034 used as a monitor of the total pressure in the reaction vessel 2030 are also provided there.

Moreover, a gas supply pipe 2031 for filling, with a nitrogen material gas, the internal space of the reaction vessel 2030, and, also, controlling the nitrogen material pressure in the reaction vessel 2030, passes through the side wall of the reaction vessel 2030. The gas supply pipe 2031 can be blocked by a valve 2032 so as to isolate the reaction vessel 2030 from the exterior. Moreover, it is possible to adjust the pressure of the nitrogen by means of a pressure regulator 2033.

In the apparatus shown in FIG. 17 described above, a configuration is provided such that a crystal may be always held at a height of the molten liquid surface (gas-to-liquid interface) 2048. That is, the crystal moving jig 2039 is automatically controlled so as to be moved downward or stopped according to existence or absence of an electric flow between the sensor contacts 2041 and 2042. Accordingly, the group-III nitride crystal 2044 may be always held on the surface (gas-to-liquid interface) 2048 of the molten liquid 2045.

Specifically, at the beginning of crystal growth, the sensor contacts 2041 and 2042 are in contact with the mixed molten liquid 2045 of group-III metal and alkaline metal, and thus, the electric flow occurs between the sensor contacts 2041 and 2042. As a result, a signal which makes the jig moving device 2036 stop movement of the jig 2039 is sent from the control unit 2047, and, thus, the jig 2039 is not moved.

On the other hand, after that, when the surface (gas-to-liquid interface) 2048 of the mixed molten liquid 2045 falls according to the progress of crystal growth, and thus, the electric flow between the contacts 2041 and 2042 is lost, a signal which moves the jig 2039 downward is sent to the jig moving device 2036 from the control unit 2047, and the moving jig 2039 moves downward. Then, when the sensor contacts 2041 and 2042 touch the molten liquid surface (gas-to-liquid interface) 2048 and thus an electric flow again occurs between the sensor contacts 2041 and 2042, the signal which makes the jig moving device 2036 stop movement of the jig 2039 is again sent from the control unit 2047, and the jig 2039 is stopped accordingly.

The holder 2040 holding the seed crystal 2043 is formed in the moving jig 2039, and the seed crystal 2043 is held by this holder 2040. The seed crystal 2043 and the sensor contacts 2041, 2042 are set at the same height. Accordingly, when sensor contacts 2041 and 2042 touch the surface (gas-to-liquid interface) 2048, the seed crystal 2043 touches the surface (gas-to-liquid interface) 2048 at the same time. Accordingly, a group-III crystal having grown from the seed crystal 2043 also touches the liquid surface (gas-to-liquid interface) 2040 when the sensor contacts 2041 and 2042 touch the surface (gas-to-liquid interface) 2048.

Therefore, in the crystal growth apparatus of FIG. 17 (nineteenth embodiment), according to movement (lowering) of the molten liquid surface (gas-to-liquid interface) 2048, the seed crystal 2043/grown-up crystal 2044 therefrom also moves, and thus, the crystal 2044 is always held on the molten liquid surface (gas-to-liquid interface) 2048.

A crystal growth process of GaN performing in use of the crystal growth apparatus of FIG. 17 will now be described.

First, Na is put into the crystal growth container 2037 as the alkaline metal, and Ga is put into the same as the group-III metal.

The amounts of these metal materials put into the container 2037 are such that the height of the surface 2048 occurring after the alkaline metal and group-III metal become a mixed molten liquid 2045 become lower slightly than the height of the sensor contacts 2041 and 2042. That is, the seed crystal holder 2040 does not touch the molten liquid 2045.

Subsequently, a seed crystal 2043 of GaN is set in the seed crystal holder 2040. At this time, the seed crystal 2043 is set in a manner such that the m-plane thereof may become parallel to the gas-to-liquid interface 2048.

Subsequently, the lid 2038 is put on the growth container 2037. Subsequently, the reaction vessel 2030 is sealed, the valve 2032 is closed, and thus, the inner space of the reaction vessel 2030 inside is isolated from the external atmosphere. Subsequently, the temperature of the heater 2035 is increased into 700 degrees C.

Subsequently, the valve 2032 is opened, a nitrogen gas is supplied from the nitrogen gas supply pipe 2031, the pressure regulator 2033 adjusts the pressure, and thus, the total pressure in the reaction vessel 2030 is set to 5 MPa.

Subsequently, the sensors 2041 and 2042 are operated. At the time of now, since the sensor contacts 2041 and 2042 do not touch the molten liquid 2045 as mentioned above, the moving jig 2039 moves downward. Accordingly, the sensor contacts 2041 and 2042 and the seed crystal 2043 move downward at the same time, and, thus, come to touch the surface 2048, and thus, the movement of the seed crystal 2043 and the sensor contacts 2041 and 2042 is stopped. Then, after maintaining this state for 200 hours, the temperature is lowered.

After also lowering the pressure of the gas in the reaction vessel 2030, in an occasion of an actual experiment, when the reaction vessel 2030 was opened, it was found out that a part of Na adhered to a lower part of the growth container 2037. Moreover, it was also found out that, although the molten liquid surface 2048 in the growth container 2037 (gas-to-liquid interface) was lowered, the sensor contacts 2041 and 2042 touched the molten liquid surface (gas-to-liquid interface) 2048. Also, it was found out that a plate-shaped single crystal of GaN 2044 having the main surface of the m-plane grew from the seed crystal 2043 in parallel with the gas-to-liquid interface 2048 was yielded.

With the crystal growth apparatus of FIG. 17, since crystal growth of the crystal 2044 can be carried out in the state where it is always held on the gas-to-liquid interface 2048, the crystal which grows from nuclear occurrence at a position at which the inner wall of the growth container and gas-to-liquid interface cross is prevented from growing up obliquely with movement of the gas-to-liquid interface, or from stopping unexpectedly. Consequently, along the gas-to-liquid interface, crystal growth of a group-III nitride can always continue, and the group-III nitride crystal of a large size having a plate shape parallel to the gas-to-liquid interface can be grown up.

Figure 18:
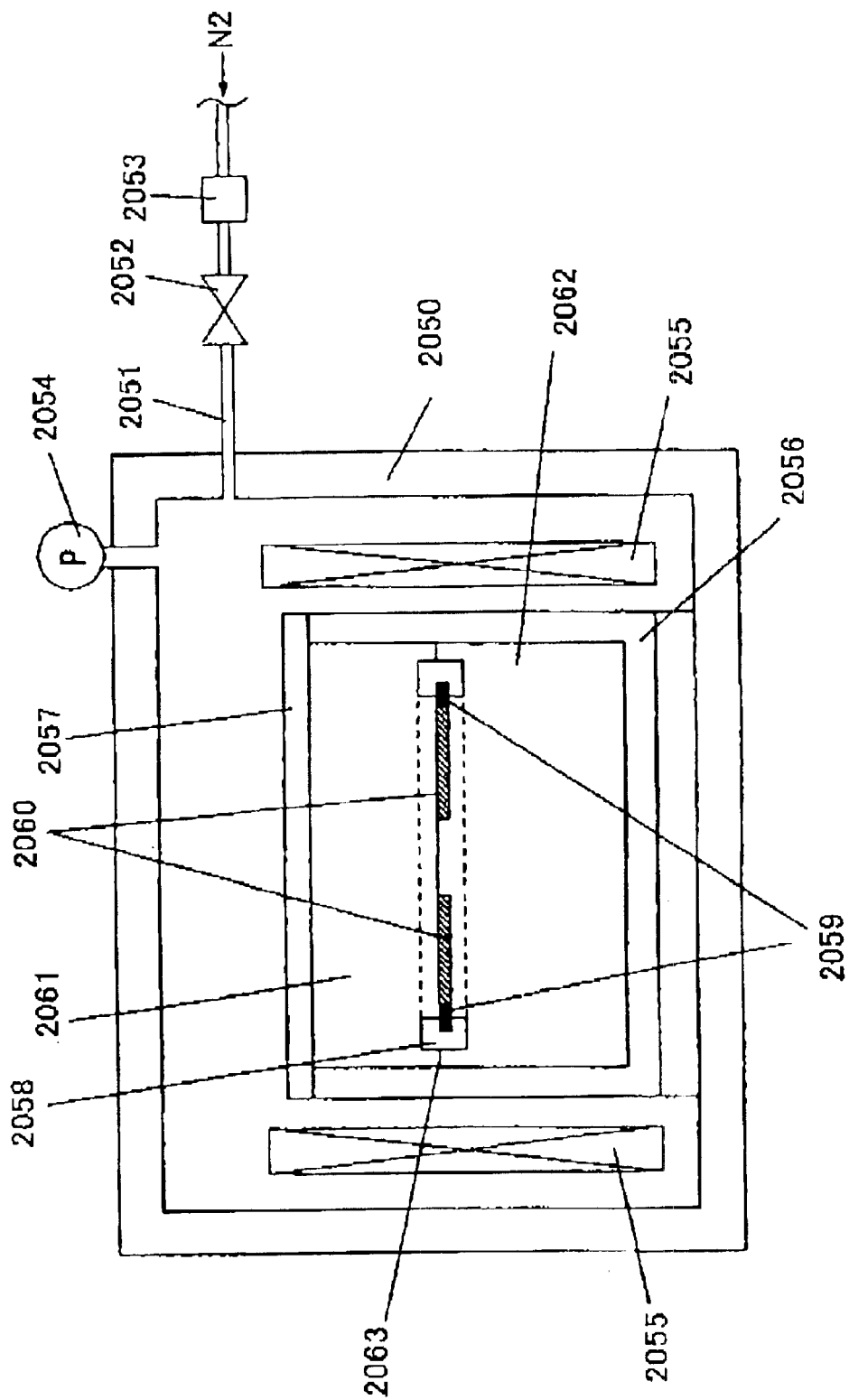
FIG. 18 shows a side-elevational sectional view of a crystal growth apparatus in a twentieth embodiment of the present invention.

FIG. 18 illustrates an example of configuration of a group-III nitride crystal growth apparatus in the twentieth embodiment of the present invention.

According to the twentieth embodiment, a reaction vessel 2050 made of stainless steel with a closed shape, a crystal growth container 2056 provided in the reaction vessel 2050 for performing crystal growth therein, a lid 2057 of the crystal growth container 2056, a crystal holding jig 2058 that holds a crystal on a gas-to-liquid interface 2063, a heater 2055, and a pressure gauge 2054 used as a monitor of the total pressure in the reaction vessel 2050, are provided in the crystal growth apparatus.

There, the material of each of the crystal growth container 2056, the lid 2057 of the crystal growth container 2056, and the crystal holding jig 2058 is BN (boron nitride).

Between the crystal growth container 2056 and the lid 2057, a narrow gap is provided. A nitrogen material gas enters into the internal space 2061 of the crystal growth container 2056 through this gap, and forms the gas-to-liquid interface 2063 with a mixed molten liquid 2062 of an alkaline metal and a group-III metal.

Figure 19:
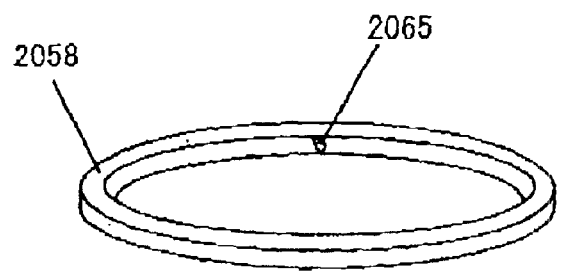
FIG. 19 illustrates a perspective view of a crystal holding jig used in the apparatus shown in FIG. 18.

FIG. 19 shows an example of the crystal holding jig 2058. As shown in the figure, the crystal holding jig 2058 which holds a crystal on the gas-to-liquid interface 2063 has a shape of a ring, and a seed crystal holder 2065 for attaching the seed crystal 2059 thereof is formed inside of the ring. In addition, in the figure, although only one seed crystal holder 2065 is shown, another seed crystal holder 2065 is provided on an opposite side of the ring.

Moreover, a gas supply pipe 2051 which makes it possible to fulfill, with a nitrogen material gas, the inner space of the reaction vessel 2050, and also, to control the nitrogen material pressure in the reaction vessel 2050 passes through the side wall of the reaction vessel 2050. The gas supply pipe 2051 can be blocked by a valve 2051 so as to isolate the internal space of the reaction vessel 2050 from the outside. Moreover, it is possible to adjust the pressure of nitrogen by means of a pressure regulator 2053.

According to the twentieth embodiment shown in FIG. 18, a crystal is made to be held on the gas-to-liquid interface 2063. That is, by using the crystal holding jig 2058 having a configuration such as to float on the mixed molten liquid 2062 of the alkaline metal and group-III metal, the crystal may always be held on the gas-to-liquid interface 2063.

Specifically, the seed crystal holders 2065 are provided on the crystal holding jig 2058, and seed crystals 2059 are set thereon. Then, the jig 2058 together with the seed crystals 2059 floats on the mixed molten liquid 2062, and, then, crystal growth is made to occur from these seed crystals 2059. Since the jig 2058 always floats on the surface of the molten liquid 2062, growing-up group-III nitride crystals 2060 are always held on the gas-to-liquid interface 2063, and, thus, growth of plate-shaped group-III nitride crystals 2060 continuously proceeds along the gas-to-liquid interface 2063.

A crystal growth process of GaN performed by using the crystal growth apparatus of FIG. 18 will now be described.

First, Na is put into the crystal growth container 2056 as the alkaline metal, and Ga is put into the same as the group-III metal.

Subsequently, seed crystals 2059 of GaN are set on the two seed crystal holders 2065 of the crystal holding jig 2058 shown in FIG. 18. At this time, the seed crystals 2059 are set in a manner such that the C-planes thereof may become parallel to the gas-to-liquid interface 2063.

Subsequently, the crystal holding jig 2058 which has the seed crystals 2059 set thereon is put into the growth container 2056, and the lid 2057 is put thereon. Subsequently, the reaction vessel 2050 is sealed, the valve 2052 is closed, and thus, the reaction vessel 2050 is isolated from the external atmosphere. Subsequently, the temperature of the heater 2055 is increased to 700 degrees C.

Subsequently, the valve 2052 is opened, a nitrogen gas is introduced from the gas supply pipe 2051, the pressure regulator 2053 adjusts the pressure thereof, and the total pressure in the reaction vessel 2050 is set as 5 MPa. This state is maintained for 200 hours, and, then, the temperature is lowered.

After also lowering the pressure of the gas in the reaction vessel 2050, in an occasion of an actual experiment, after the reaction vessel 2050 was opened, it was found out that a part of Na adhered to a lower part of the growth container 2056. Moreover, although the molten liquid surface 2063 in the growth container 2056 (gas-to-liquid interface) lowered, the crystal holding jig 2058 was in contact with the molten liquid surface (gas-to-liquid interface) 2063, and, as shown in FIG. 20, plate-shaped single crystals 2060 of GaN grew from the seed crystals 2059 which have the main surfaces of the C-planes parallel to the gas-to-liquid interface 2063 were yielded.

Figure 20:
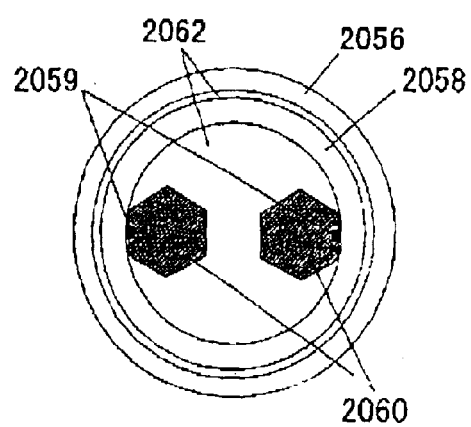
FIGS. 20 and 21 illustrate examples of crystal growth according to the present invention.
Figure 21:
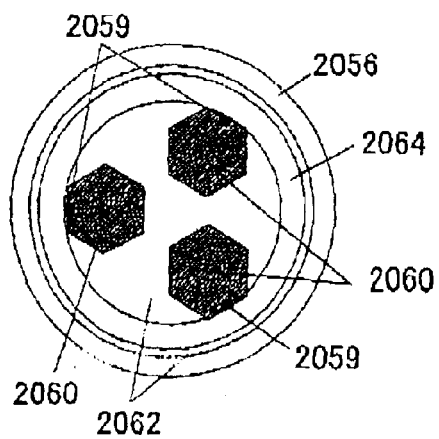

FIG. 21 shows a case of using a crystal holding jig (with three seed crystal holders) thus holding three seed crystals, and crystal growth is performed by the same method in the configuration shown in FIGS. 19 and 20.

In this case, in an actual experiment, three plate-shaped single crystals 2060 of GaN each of which had the main surface of the C-plane grew from the seed crystals 2059 parallel to the gas-to-liquid interface 2063 are yielded.

According to the crystal growth apparatus of FIG. 18, since crystal growth of crystals 2060 can be carried out in a state where the crystals are always held on the gas-to-liquid interface 2063, the crystals occurring as nucleuses at a position where the inner wall of the growth container crosses the gas-to-liquid interface are prevented from growing obliquely with lowering of the gas-to-liquid interface, or from stopping growth unexpectedly. Consequently, along the gas-to-liquid interface, crystal growth of group-III nitride can be always continued, and the group-III nitride crystals having large sizes with plate shapes parallel to the gas-to-liquid interface can be grown up.

Figure 22:
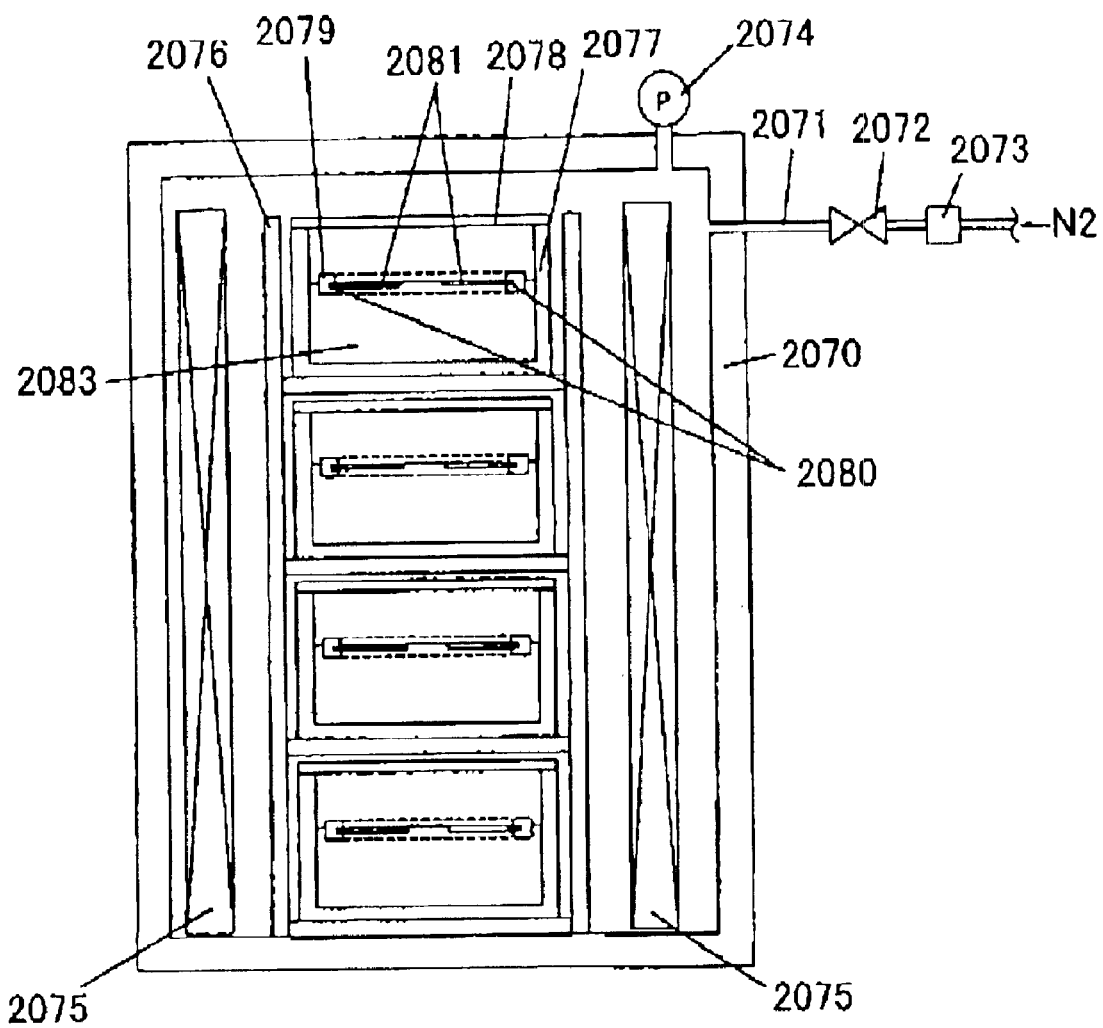
FIG. 22 shows a side-elevational sectional view of a crystal growth apparatus in a twenty-first embodiment of the present invention.

FIG. 22 illustrates an example of configuration of a group-III nitride crystal growth apparatus according to the twenty-first embodiment of the present invention.

Basically, the crystal growth apparatus according to the twenty-first embodiment is the same as the crystal growth apparatus according to the twentieth embodiment described above. However, the twenty-first embodiment has a configuration such that four crystal growth containers can be accommodated at the same time as shown.

A reaction vessel 2070 made of stainless steel having a closed shape, four crystal growth containers 2077 provided in the reaction vessel 2070 and performing crystal growth therein, respective lids 2078 of the crystal growth containers 2077, crystal holding jigs 2079 that hold crystals on respective gas-to-liquid interfaces, a heater 2075, a pressure gauge 2074 used as a monitor of the total pressure in the reaction vessel 2070 and a support stand 2076 for supporting the four crystal growth containers 2077, are provided in the crystal growth apparatus according to the twenty-first embodiment.

Each of the crystal growth containers 2077, each of the lids 2078, and each of the crystal holding jigs 2079 are the same as those of the crystal growth apparatus according to the above-described twentieth embodiment.

Moreover, in the apparatus shown in FIG. 22, a gas supply pipe 2071 which makes it possible to fulfill the internal space of the reaction vessel 2070 with a nitrogen material gas, and to control the nitrogen material pressure in the reaction vessel 2270, passes through the side wall of the reaction vessel 2070. The gas supply pipe 2071 may be isolated from the exterior by the valve 2072. Moreover, it is possible to adjust the pressure of nitrogen with the pressure regulator 2073.

Moreover, as each crystal holding jig 2079 which holds a crystal along a respective gas-to-liquid interface, the same device as that shown in FIG. 21 may be used In this case, each crystal holding jig 2079 has a ring shape, and three seed crystal holders each of which holds a seed crystal 2080 are provided on the inside of the ring.

The same process as,that in the twentieth embodiment described above may be performed in the crystal growth apparatus of FIG. 22. A different point is that Na, Ga, and seed crystals 2080 are set in each of the four crystal growth containers 2077 at once. As a result, total 12 plate-shaped crystals 2081 of group-III nitride (GaN) can be made to grow up by one growth process by setting three seed crystals 2080 in each crystal holding jig 2079, and performing crystal growth in the crystal growth apparatus of FIG. 22. In addition, in FIG. 22, a reference numeral 2083 denotes a mixed molten liquid. As described above, many plate-shaped GaN single crystals can be yielded at once by using the apparatus according to the twenty-first embodiment.

Thus, according to each of the eighteenth through twenty-first embodiments described above, when making a group-III metal material and a nitrogen material react in a mixed molten liquid containing an alkaline metal and the group-III metal material and growing up an group-III nitride crystal therefrom, around a gas-to-liquid interface between the mixed molten liquid containing the alkaline metal and group-III metal and the nitrogen material gas, or around a gas-to-liquid interface between the mixed molten liquid containing the alkaline metal and group-III metal and a nitrogen gas having the nitrogen material decomposed therein, a group-III nitride crystal on growth is continuously held, so that a plate-shaped group-III nitride crystal may grow in parallel to the gas-to-liquid interface.

In other words, according to this aspect of the present invention, a position of crystal growth is made to be just on a gas-to-liquid interface, and, thus, during crystal growth, the crystal on growth is held on the gas-to-liquid interface. Thereby, in general, it is possible to make the main surface of the crystal grow parallel to the gas-to-liquid interface so as to yield a plate-shaped crystal having a large area, i.e., on the order of several hundreds of micrometers. When crystal growth is made in a manner of spontaneous nucleolus occurrence, the main surface becomes the C-plane. However, by making crystal growth by preparing a seed crystal beforehand and setting it with the main surface of a desired crystal plane, it is possible to grow up a crystal having the desired crystal plane other than the C-plane as the main surface thereof.

According to the present invention, as the alkaline metal, Na (sodium) or K (potassium) may be usually used. However, another alkaline metal may also be used.

Moreover, the group-III nitride means a compound of a group-III metal chosen from gallium, aluminum, and indium, and nitrogen.

Moreover, another element may also be mixed into the mixed molten liquid containing the alkaline metal and group-III metal. For example, n-type impurities or p-type impurities may be mixed there, and, thereby, doping may be made to occur.

Moreover, as the nitrogen material, a nitrogen gas, a material having a constituent of a nitrogen such as a compound of a nitrogen with another element, may be used. Therefore, the nitrogen material may be either of a gaseous phase, or a liquid phase. However, it is most preferable to apply a gaseous phase of the nitrogen material. That is, in this case, it is possible that the nitrogen material is supplied from a gaseous phase as the nitrogen gas, and the nitrogen density is made highest around the gas-to-liquid interface in the mixed molten liquid. Thereby, crystal growth of a crystal having a satisfactory quality can be made to grow around the gas-to-liquid interface.

That is, by supplying a sufficient amount of nitrogen which determines the growth speed, the crystal growth can be made to proceed at a high speed. Moreover, defects, such as nitrogen voids otherwise occurring due to shortage of nitrogen, can be effectively reduced, and, thus, a quality group-III nitride can be grown up.

Specifically as the nitrogen material, a nitrogen gas may be used. Moreover, by supplying the nitrogen material in a gaseous phase, nitrogen concentration in the molten liquid can be made smaller, and, thereby, undesirable crystal growth on the side wall or the bottom of the crystal growth container can be effectively avoided. Accordingly, it is possible to effectively reduce useless consumption of group-III material.

According to the eighteenth through twenty-first embodiments, a seed crystal is held in a manner such that a predetermined crystal plane is made to be parallel to the gas-to-liquid interface. Thereby, a plate-shaped group-III crystal having the main surface of the desired crystal plane parallel to the gas-to-liquid interface can be made to grow up.

In fact, when a plate-shaped group-III crystal is made to grow on the gas-to-liquid interface in a spontaneous nucleus occurrence manner, the C-axis of the crystal becomes perpendicular to the gas-to-liquid interface, normally. That is, in this method, the C-plane becomes parallel to the gas-to-liquid interface is yielded, and thus the plate-shaped crystal of the group-III nitride which has the C-plane of the main surface grows.

On the other hand, according to the eighteenth through twenty-first embodiments of the present invention, by setting a seed crystal in a manner such that the surface orientation thereof is arbitrarily determined beforehand as mentioned above, it is possible to grow a plate-shaped crystal having the main surface of a desired crystal plane.

Specifically, according to this aspect of the present invention, for example, the crystal plane of a seed crystal to be made parallel to the gas-to-liquid interface is (1-100) m-plane or (11-20) a-plane. Thereby, a plate-shaped group-III nitride crystal having the main surface of the m-plane or a-plane parallel to the gas-to-liquid interface is made to grow.

According to each of the above-described first through seventeenth embodiments described with reference to FIGS. 5, 11–13, in the group-III nitride crystal growth apparatus, the heating device/heater for heating materials of group-III nitride so as to raise the temperature thereof such that crystal growth may occur therein is provided outside of the reaction vessel.

In fact, in the reaction vessel, in order to perform nucleus occurrence control for a group-III nitride or evaporation control of an alkaline metal, the temperature distribution control should be preferably made. However, in the case where the heating device/heater is provided outside of the reaction vessel, it may be difficult to perform the temperature distribution control in the reaction vessel with a sufficient accuracy. Therefore, nucleus occurrence control of the group-III nitride and evaporation control of the alkaline metal may not be achieved with a sufficient accuracy.

According to the crystal growth conditions for group-III nitride described above, the alkaline metal may have a steam pressure, and, thereby, the alkaline metal may escape to the outside of the mixed molten liquid container in a form of steam. For this reason, the amount ratio between the group-III metal and alkaline metal in the mixed molten liquid may change, and thereby, growth condition control may be become difficult. In such a situation, it may be difficult to raise the crystal quality.

Twenty-second through twenty-fifth embodiments of the present invention which will now be described have been devised so as to solve this problem, and the concept thereof may be combined with any of the above-described other embodiment of the present invention. The object of this aspect of the present invention is to enable high-accuracy control of temperature distribution in the reaction vessel with an easy way, to enable high-accuracy control of evaporation of the alkaline metal, and thus to enable to provide a group-III nitride crystal growth apparatus which can yield group-III nitride crystals having improved crystal quality.

Figure 23A:
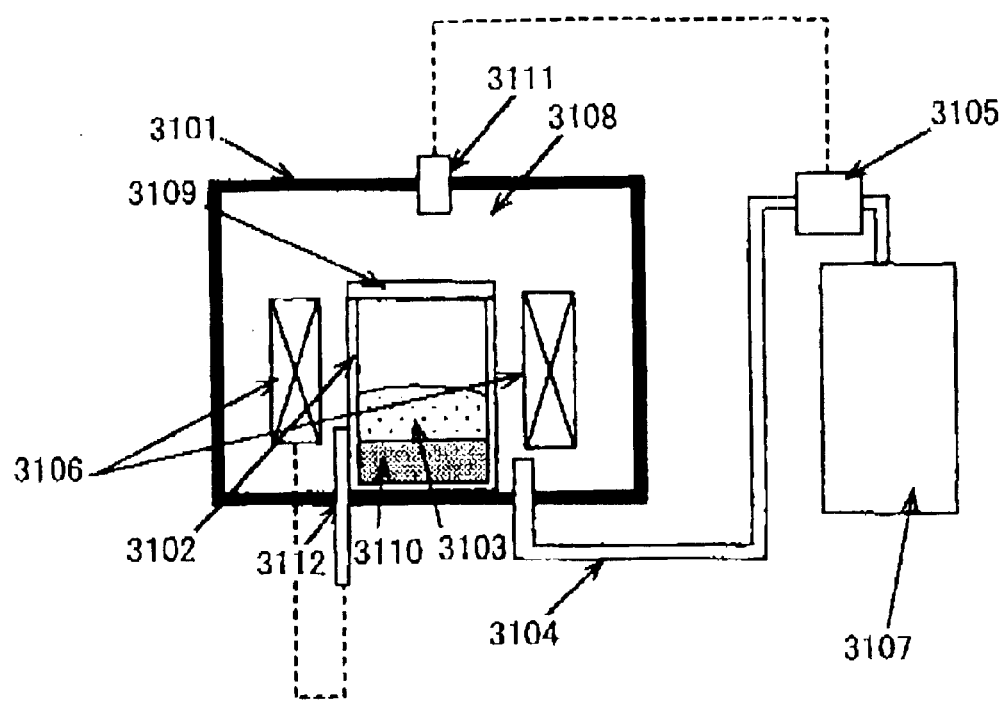
FIGS. 23A and 23B show a side-elevational sectional view of a crystal growth apparatus in a twenty-second embodiment of the present invention.

FIG. 23A illustrates an example of configuration of a group-III nitride crystal growth apparatus according to the twenty-second embodiment of the present invention. As shown in the figure, the crystal growth apparatus includes a mixed molten liquid container 3102 for holding a mixed molten liquid 3103 of an alkaline metal (in this following example, Na) and a material which contains a group-III metal (in this following example, Ga) at least in a reaction vessel 3101.

The alkaline metal may be supplied from the outside or may be beforehand provided in the reaction vessel 3101.

Moreover, a lid 3109 is provided on the mixed molten liquid container 3102, and a narrow gap such that a gas can communicate therethrough is provided between the mixed molten liquid container 3102 and the lid 3109.

Moreover, the reaction vessel 3101 is made of stainless steel. Moreover, the mixed molten liquid container 3102 and the lid 3109 may be made of BN (boron nitride), AlN, or a pyrolytic BN, or may be made of a metal, such as tungsten (W), stainless steel (SUS), nickel, or the like. Moreover, a heating device may be prepared in the mixed molten liquid container 3102.

Moreover, a supply pipe 3104 for supplying a material (for example, a nitrogen gas or an ammonia gas) which contains nitrogen at least into the reaction vessel 3101 is provided in the group-III nitride crystal growth apparatus of FIG. 23A. The above-mentioned material containing nitrogen at least used in the embodiment means nitrogen molecules, molecules produced from a compound containing nitrogen, nitrogen in the form of nitrogen atoms, atomic groups or molecular groups containing nitrogen.

Moreover, the material which contains nitrogen at least is held by a container 3107. A nitrogen gas is held by the container 3107 when a nitrogen gas is used as the material which contains nitrogen at least.

Moreover, when using a nitrogen gas as the material which contains nitrogen at least, in order to adjust the pressure of nitrogen gas, the pressure adjustment mechanism (for example, a pressure regulator valve) 3105 is provided in the supply pipe 3104. Moreover, in the apparatus of FIG. 23A, a pressure sensor 3111 which detects the pressure of the nitrogen gas in the reaction vessel 3101 is provided, and the pressure sensor 3111 is configured so that a feedback may be provided to the pressure adjustment mechanism 3105 such that the pressure in the reaction vessel 3101 may be controlled at a predetermined pressure.

According to the embodiment of the present invention, a nitrogen gas can be supplied to the space 3108 in the reaction vessel 3101 through the supply pipe 3104 from the container 3107 provided outside of the reaction vessel 3101, using the nitrogen gas as the material which contains nitrogen at least. In this case, the nitrogen gas is made to be supplied through the bottom of the reaction vessel 3101 as shown in a FIG. 23A. The pressure adjustment mechanism 3105 can adjust the pressure of the nitrogen gas.

Moreover, in this embodiment, a heating unit 3106 used for heating an group-III nitride (for example, GaN) is provided so as to raise the temperature thereof into a predetermined temperature such that crystal growth thereof occurs, in the reaction vessel 3101.

This heating unit includes a heating device 3016 provided in the reaction vessel 3101 and a temperature sensor 3112 which provides a feedback to the heating device 3106.

Namely, according to the twenty-second embodiment, one heating device 3106 is provided in the reaction vessel 3101, and temperature control of this heating device 3106 is performed.

By providing the heating device 3106 in the reaction vessel 3101, the temperature distribution in the reaction vessel 3101 can be easily controlled with a sufficient accuracy, and, thereby, crystal nucleus occurrence control of group-III nitride and evaporation control of alkaline metal can be performed also with a sufficient accuracy. Thereby, the crystal quality of the group-III nitride crystal 3110 yielded there can be effectively raised.

In fact, in case a heating device is provided in the outside of a reaction vessel, a wall of the reaction vessel is inserted between the heating device and a mixed molten liquid, and thus, the heat resistance between the heating device and the mixed molten liquid should be increased Thereby, temperature control accuracy of the mixed molten liquid may not be sufficiently increased. On the other hand, according to the twenty-second embodiment of the present invention described above with reference to FIG. 23A, since the heat resistance between the heating device 3106 and the mixed molten liquid 3103 can be effectively reduced, it becomes possible achieve high-accuracy temperature control of the mixed molten liquid 3103. In the case of applying a scheme of crystal growth control according to the crystal growth conditions defined by the respective zones illustrated in FIG. 6 described above, for example, it is important to control the temperature of the mixed molten liquid of the alkaline metal and group-III metal. In such a case, the scheme of the twenty-second embodiment of providing the heating device inside of the reaction vessel so as to improve controllability of temperature of the mixed molten liquid is especially advantageous.

Figure 23B:
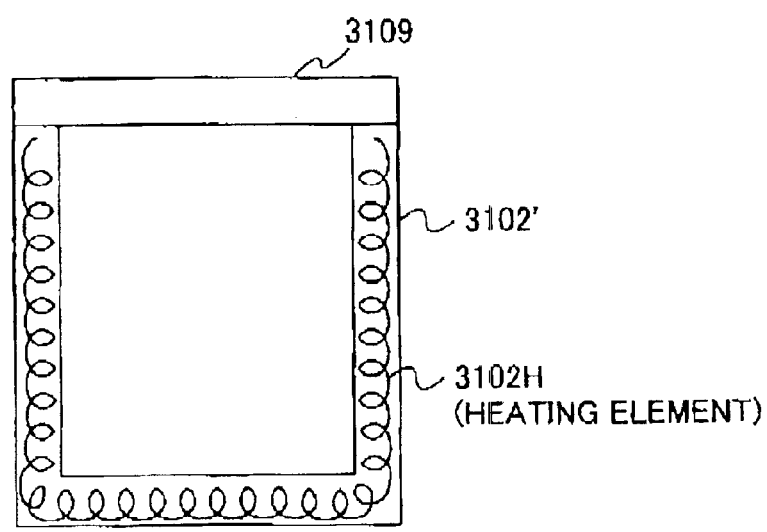

Furthermore, as shown in FIG. 23B, it is also possible to provide a heating element 3102H in the wall of the mixed molten liquid container 3102' by which the temperature of the mixed molten liquid held thereby can be made with further high accuracy.

Figure 24:
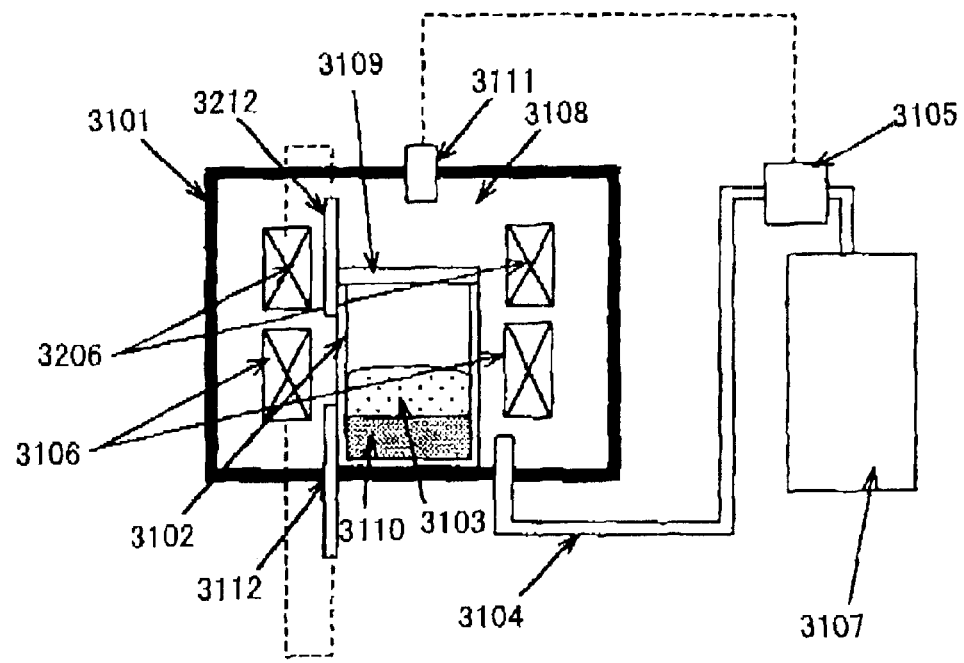
FIG. 24 shows a side-elevational sectional view of a crystal growth apparatus in a twenty-third embodiment of the present invention.

FIG. 24 illustrates an example of configuration of a group-III nitride crystal growth apparatus according to the twenty-third embodiment of the present invention. As shown in the figure, this group-III nitride crystal growth apparatus has the same configuration as the group-III nitride crystal growth apparatus of FIG. 23 basically. However, in the configuration shown in FIG. 24, two heating devices 3106 and 3206 are provided in the reaction vessel 3101, differently from the configuration shown in FIG. 23 in which only the single hating device 3106 is provided.

For the two heating devices 3106 and 3206, two sensors 3112 and 3212 are also provided for providing feedbacks to the respective heating devices 3106 and 3206.

The first temperature sensor 3112 detects the temperature of a lower part of the mixed molten liquid container 3102, while the second temperature sensor 3212 detects an upper part of the mixed molten liquid container 3102. The first temperature sensor 3112 provides a feedback to the first heating devices 3106, while the second temperature sensor 3212 provides a feedback to the second heating device 3206. The first heating device 3106 carries out a heating control of the lower part of the mixed molten liquid container 3102, and the second heating device 3206 carries out a heating control of the upper part of the mixed molten liquid container 3206.

Accordingly, the heating device 3106 functions to control the temperature of the group-III nitride inside of the mixed molten liquid 3103, or the surface of the mixed molten liquid 3103 into a temperature in which crystal growth may occur therein. The second heating device 3206 functions to control the temperature of a part above the surface of the mixed molten liquid 3103.

In other words, according to the twenty-third embodiment, in the reaction vessel 3101, a plurality of heating devices (in this example, two heating devices) 3106, 3206 are provided, which can be controlled independently. Thereby, the temperature distribution in the reaction vessel 3101 can be controlled with a further sufficient accuracy easily, crystal nucleus occurrence control of the group-III nitride and evaporation control of the alkaline metal can be performed with a much more sufficient accuracy, and thus, the crystal quality of the group-III nitride crystal 3110 yielded there can be further effectively raised.

Specifically, according to the twenty-third embodiment of the present invention, the temperature above the surface of the mixed molten liquid 3103 is raised by the second heating device 3206, and, thereby, the upper part of the mixed molten liquid 3103 is made to have a higher temperature. Accordingly, evaporation of the alkaline metal from the mixed molten liquid 3103 can be effectively reduced. That is, escape of the alkaline metal from the mixed molten liquid container 3102 to the outside in a form of steam can be effectively reduced. Thereby, change in the amount ratio between the group-III metal and the alkaline metal can be well reduced, and thus, the crystal quality of the group-III nitride crystal thus yielded can be further improved.

Figure 25:
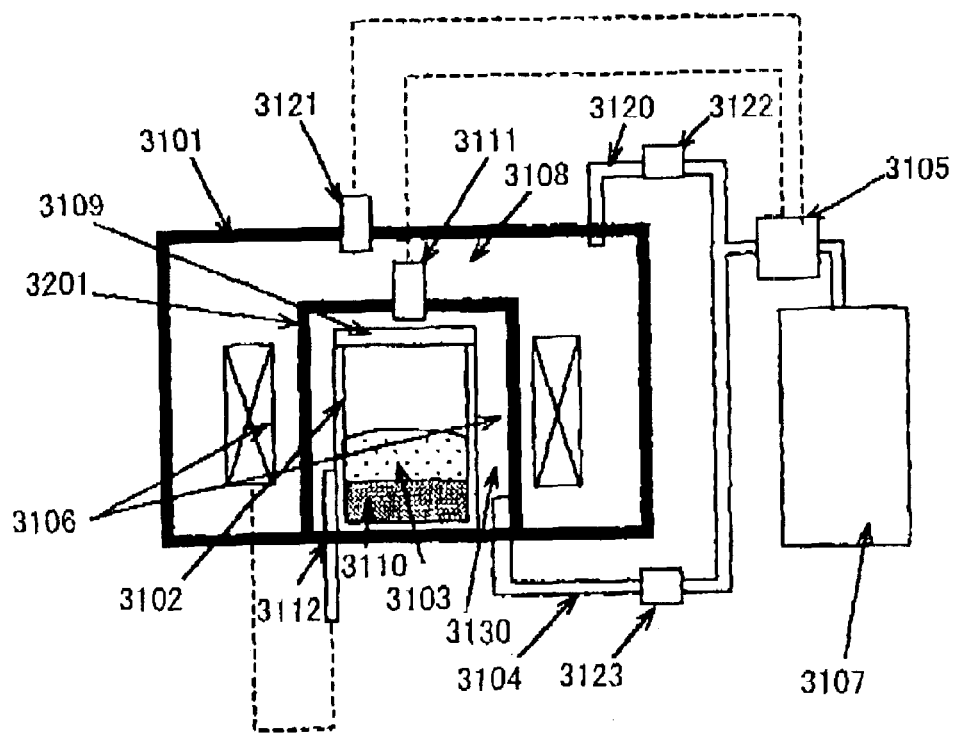
FIG. 25 shows a side-elevational sectional view of a crystal growth apparatus in a twenty-fourth embodiment of the present invention.

FIG. 25 illustrates an example of configuration of a group-III nitride crystal growth apparatus according to the twenty-fourth embodiment of the present invention. As shown in the figure, in the twenty-fourth embodiment, a mixed molten liquid container 3102 holding a mixed molten liquid 3103 of an alkaline metal (in this example, Na) and a material which contains a group-III metal (in this example, Ga) at least is provided in a first reaction vessel 3201.

The alkaline metal may be supplied from the outside or may be provided in the first reaction vessel 3201 beforehand.

Moreover, a lid 3109 is provided on the mixed molten liquid container 3102, and a narrow gap such that a gas may communicate therethrough between the mixed molten liquid container 3102 and the lid 3109.

Moreover, the mixed molten liquid container 3102 and the lid 3109 may be made of BN (boron nitride), AlN, or pyrolytic BN, or may be made of a metal, such as tungsten (W), stainless steel (SUS), or nickel. Moreover, a heating device may be provided in a wall of the mixed molten liquid container 3102, as shown in FIG. 23B.

Moreover, in the group-III nitride crystal growth apparatus of the twenty-fourth embodiment, a second reaction vessel 3101 is provided outside of the first reaction vessel 3201, and a heating unit for controlling the temperature of a group-III nitride (for example, GaN) so as to set the temperature thereof such that crystal growth may occur there, is provided between the wall of the first reaction vessel 3201 and the wall of the second reaction vessel 3101.

The above-mentioned heating unit includes a heating device 3106 provided between the wall of the first reaction vessel 3201 and the wall of the second reaction vessel 3101, and a sensor 3112 which detects the temperature of the mixed molten liquid container 3102 and provides a feedback to the heating device 3106.

Moreover, the first and second reaction vessel 3201 and 3101 are both made of stainless steel.

Moreover, the atmosphere in the first reaction vessel 3201 and the atmosphere outside thereof and inside of the second reaction vessel 3101 can be independently controlled.

Moreover, a supply pipe 3104 for supplying a material (for example, a nitrogen gas or an ammonia gas) which contains nitrogen at least into the first reaction vessel 3201, and a supply pipe 3120 for supplying a material (for example, a nitrogen gas or a ammonia gas) which contains nitrogen at least into the second reaction vessel 3101 are provided separately in the group-III nitride crystal growth apparatus of FIG. 25. The above-mentioned material containing nitrogen at least means nitrogen molecules, molecules produced from a compound containing nitrogen, nitrogen in the form of nitrogen atoms, atomic groups or molecular groups containing nitrogen.

Moreover, the material which contains nitrogen at least is first held by a container 3107. A nitrogen gas is held by the container 3107 when the nitrogen gas is used as the material which contains nitrogen at least.

Check valves 3123 and 3122 are respectively provided in the supply pipes 3104 and 3120 on the ways. These check valves 3123 and 3122 are set in a manner such that, although the gas may move therethrough toward the respective one of the reaction vessels from the container 3107, no gas may move therethrough toward the outside from the respective one of the reaction vessels.

Moreover, when a nitrogen gas is used as the material which contains nitrogen at least, in order to adjust the pressure of the nitrogen gas, a pressure adjustment mechanism (for example, pressure regulator valve) 3105 is provided for the supply pipes 3104 and 3120. Moreover, in the apparatus of FIG. 25, a pressure sensor 3111 which detects the pressure in the first reaction vessel 3201, and a pressure sensor 3211 which detects the pressure in the second reaction vessel 3101 are provided, and the pressure sensor 3111 and the pressure sensor 3211 are configured such that a feedback may be provided to the pressure adjustment mechanism 3105 such that the pressure in the first reaction vessel 3201 or the pressure in the second reaction vessel 3101 may be controlled at respective one of predetermined pressures.

In this embodiment, a nitrogen gas is employed as the material containing nitrogen at least. Then, the nitrogen gas can be supplied to the space 3130 or 3108 in the first or second reaction vessel 3201 or 3101 through the respective one of the supply pipes 3104 and 3120 from the container 3107 provided outside of the first and second reaction vessels 3201 and 3101. At each of the times, the pressure adjustment mechanism 3105 can adjust the pressure of the nitrogen gas.

By such a configuration, the pressure difference between the inside of the first reaction vessel 3201 and the outside thereof and the inside of the second reaction vessel 3101, i.e., the pressure difference between the inside and outside of the first reaction vessel 3201, can be reduced.

Moreover, in the group-III nitride crystal growth apparatus of FIG. 25, a configuration is made such that the alkaline metal steam from the mixed molten liquid 3103 may be prevented from escaping from the first reaction vessel 3201.

According to each of the above-described twenty-second and twenty-third embodiments of FIGS. 23 and 24, the temperature distribution in the reaction vessel 3101 can be easily controlled with a sufficient accuracy by providing the heating device inside of the reaction vessel 3101. However, in this configuration, there is a possibility that the heating device may corrode, as the heating device is provided within the reaction vessel 3101 in which the alkaline metal steam exists.

On the other hand, according to the twenty-fourth embodiment of FIG. 25, since the heating device 3106 is provided outside of the first reaction vessel 3201 and thus the alkaline metal steam evaporated from the mixed molten liquid 3103 is prevented from escaping from the first reaction vessel 3201 as mentioned above, the heating device 3106 can be prevented from being exposed to the alkaline metal steam, and thus, prevented from subject to corrosion.

However, according to the configuration in which the heating device 3106 is provided outside of the first reaction vessel 3201, if the thickness of the first reaction vessel 3201 were large, it might be difficult to perform the temperature distribution control in the first reaction vessel 3201 with a sufficient accuracy. Thus, crystal nucleolus occurrence control of the group-III nitride and evaporation control of the alkaline metal might not be performed with a sufficient accuracy.

However, according to the twenty-fourth embodiment of FIG. 25, the pressure in the first reaction vessel 3201 and the pressure outside thereof and in the second reaction vessel 3101 can be made almost the same as mentioned above, and, thus, the first reaction vessel 3201 can be formed with a material (for example, stainless steel of a reduced wall thickness) of a reduced wall thickness. By this, since the first reaction vessel 3201 can thus be made of a thin wall even though the heating device 3106 is provided outside of the first reaction vessel 3201, the temperature distribution in the first reaction vessel 3201 can be easily and positively controlled with a sufficient accuracy, and crystal nucleolus occurrence control of the group-III nitride and evaporation control of the alkaline metal can be performed with a sufficient accuracy.

Thus, according to the twenty-forth embodiment, as the heating device 3106 is provided between the wall of the first reaction vessel 3201 and the wall of the second reaction vessel 3101, the heating device 3106 can be effectively prevented from being exposed to the alkaline metal steam, and thus, corrosion,thereof can be effectively avoided. Also, as mentioned above, the temperature distribution in the first reaction vessel 3201 can be easily controlled with a sufficient accuracy, crystal nucleolus occurrence control of the group-III nitride and evaporation control of the alkaline metal can be performed with a sufficient accuracy, and thus, the crystal quality of the group-III nitride crystal thus yielded can be effectively raised.

Figure 26:
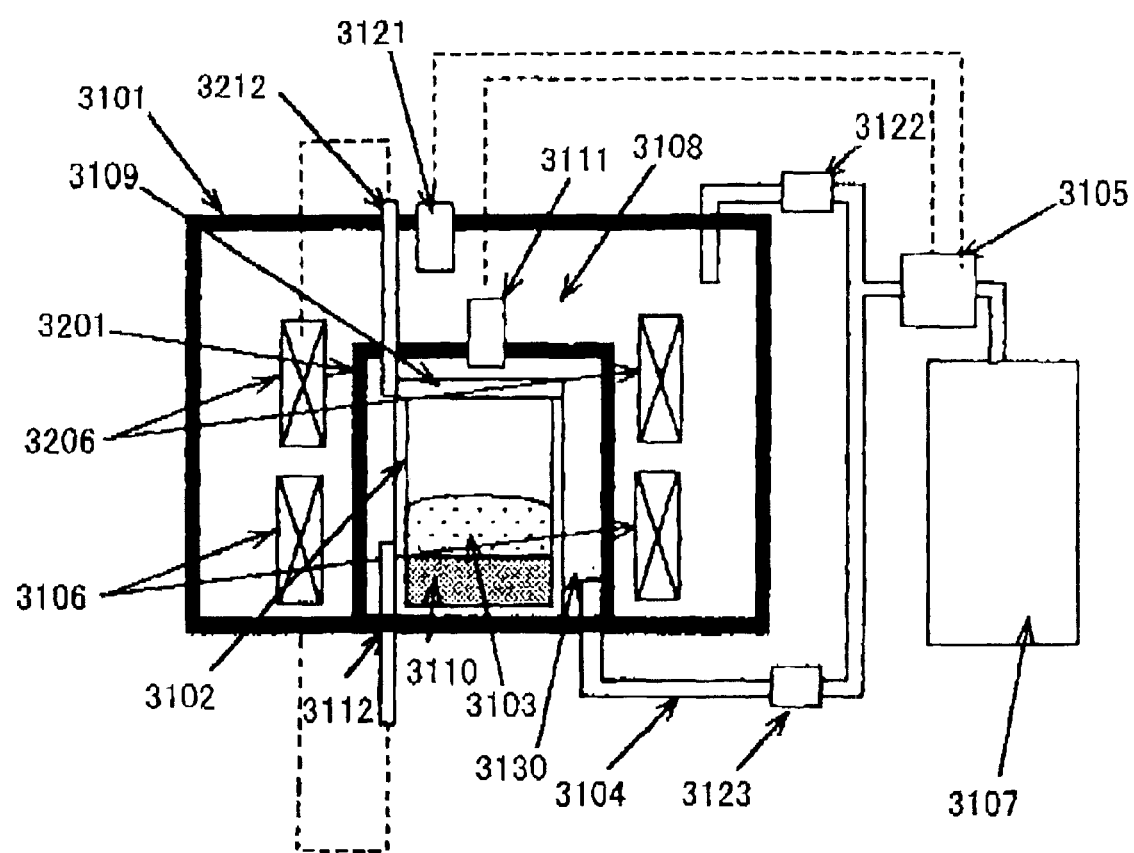
FIG. 26 shows a side-elevational sectional view of a crystal growth apparatus in a twenty-fifth embodiment of the present invention.

FIG. 26 illustrates an example of a configuration of a group-III nitride crystal growth apparatus according to the twenty-fifth embodiment of the present invention. As shown in the figure, this group-III nitride crystal growth apparatus differs in configuration of a heating unit provided between the wall of the first reaction vessel 3201 and the wall of the second reaction vessel 3101, from the group-III nitride crystal growth apparatus of FIG. 25 described above. Other than this point, the twenty-fourth and twenty-fifth embodiments are basically the same as one another.

That is, according to the twenty-fifth embodiment of FIG. 26, the heating unit includes two heating devices 3106 and 3206 provided between the respective walls of the first and second reaction vessels 3201 and 3101, and temperature sensors 3112 and 3121 which detect the temperatures of the mixed molten liquid container 3102 respectively and provide feedbacks to the heating devices 3106 and 3206 respectively.

The first temperature sensor 3112 detects the temperature of a lower part of the mixed molten liquid container 3102, while the second temperature sensor 3212 detects the temperature of an upper part of the mixed molten liquid container 3102. The first temperature sensor 3112 provides a feedback to the first heating device 3106, and the second temperature sensor 3212 provides a feedback the second heating device 3206. The first heating device 3106 carries out heating control of the lower part of the mixed molten liquid container, and the second heating device 3206 carries out heating control of the upper part of the mixed molten liquid container.

Accordingly, the first heating device 3106 is used for controlling the temperature inside of the mixed molten liquid 3103 or the temperature of the surface of the mixed molten liquid 3103 to bring it to a temperature in which crystal growth may occur. The second heating device 3206 is used for controlling the temperature of the upper part of the first reaction vessel 3201 so as to control the temperature above the surface of the mixed molten liquid 3103.

Thus, according to the twenty-fifth embodiment of FIG. 26, a plurality of heating devices (in this example, two) 3106, 3206 as the heating unit are provided between the respective walls of the first reaction vessel 3201 and the second reaction vessel 3101, and temperature control can be independently performed on each of the heating devices 3106, 3206.

Also, same as in the group-III nitride crystal growth apparatus of FIG. 25, the pressure difference between the inside of the first reaction vessel 3201 and the outside thereof, i.e., inside of the second reaction vessel 3101 can be reduced by appropriately controlling the pressures thereof by means of the pressure regulator 3105 and valves 3122, 3123.

Moreover, also in the group-III nitride crystal growth apparatus of FIG. 26, a configuration is provided such that the alkaline metal steam evaporating from the mixed molten liquid 3103 may be prevented from escaping from the first reaction vessel 3201.

Accordingly, also in this twenty-fifth embodiment, since the heating devices 3106, 3206 are provided outside of the first reaction vessel 3201 and the alkaline metal steam evaporating from the mixed molten liquid 3103 is prevented from escaping from the first reaction vessel 3201 as mentioned above, the heating devices 3106, 3206 can be prevented from being exposed to the alkaline metal steam, and thus, corrosion thereof can be avoided.

And also in this twenty-fifth embodiment, since the pressure in the first reaction vessel 3201 and the pressure in the second reaction vessel 3101, i.e., the pressures inside and outside of the first reaction vessel 3010 can be made almost the same as mentioned above, the first reaction vessel 3201 can be made of a material (for example, stainless steel) of a thin wall thickness. By this, since the first reaction vessel 3201 is thus made of a thin wall, even though the heating devices 3106, 3206 are provided outside of the first reaction vessel 3201, the temperature distribution in the first reaction vessel 3201 can be easily and positively controlled with a sufficient accuracy, and crystal nucleolus occurrence control of the group-III nitride and evaporation control of the alkaline metal can be performed with a sufficient accuracy. Thus, the crystal quality of a group-III nitride crystal can be effectively raised.

Specifically, according to the twenty-fifth embodiment, the temperature above the surface of the mixed molten liquid 3103 is raised by the second heating device 3206, and evaporation of the alkaline metal from the mixed molten liquid 3103 can be thus well prevented because the upper part of mixed molten liquid 3103 thus has a higher temperature in the temperature distribution of the mixed molten liquid 3103.

That is, movement of the alkaline metal from the mixed molten liquid container 3102 to the outside can be well controlled. Thereby, change in the quantity ratio between the group-III metal and the alkaline metal in the mixed molten liquid can be well reduced, and the crystal quality of a group-III nitride crystal thus yielded can be raised further effectively. That is, a group-III nitride crystal thus yielded can have a further improved crystal quality as a result of the amount ratio of group-III metal and alkaline metal being fixed to a predetermined value.

Further, the present invention is not limited to the above-described embodiments, and variations and modifications may be made without departing from the basic concepts of the present invention.

The present application is based on Japanese priority applications Nos. 2002-019986, 2001-371147, 2002-003312 and 2002-119453, filed on Jan. 29, 2002, Dec. 5, 2001, Jan. 10, 2002 and Apr. 22, 2002, respectively, the entire contents of which are hereby incorporated by reference.

Furthermore, the present application relates to the previous U.S. patent applications Ser. No. 09/981,848 and Ser. No. 10/134,895, filed on Oct. 16, 2001 and Apr. 30, 2002, respectively, the entire contents of which are hereby incorporated by reference.

What is claimed is:

1. A group-III nitride crystal growth method, comprising the steps of:
   a) preparing a mixed molten liquid of an alkaline metal and a material at least comprising a group-III metal;
   b) growing a group-III nitride crystal of the group-III metal and nitrogen from the mixed molten liquid and a material at least comprising nitrogen; and
   c) setting a predetermined crystal growth condition according to a zone defined by a pressure and a temperature in said step b).

2. The method as claimed in claim 1, wherein:
   said step c) sets the predetermined crystal growth condition according to the zone from among a plurality of zones each defined by the pressure and temperature in said step b); and
   different modes of crystal growth may occur according to respective ones of the plurality of zones.

3. The method as claimed in claim 2, wherein:
   under the crystal growth condition according to a zone of the plurality of zones, the crystal grows from a seed crystal.

4. The method as claimed in claim 2, wherein:
   the plurality of zones are defined by a curve expressed by the following expression:

$$\log P = a/T + b$$

where:
P denotes the effective pressure (Pa) of nitrogen in a reaction vessel in which said step b) is performed;
T denotes the absolute temperature (K) of the mixed molten liquid; and
a and b denote coefficients.

5. The method as claimed in claim 4, wherein:
the curve expressed by the following formula:

$$\log P = a/T + b$$

is controllable according to a ratio in amount between the alkaline metal and group-III metal to be used in said step b).

6. The method as claimed in claim 1, wherein:
in said step b), the crystal is made to grow from a seed crystal under the crystal growth condition such that crystal growth from a seed crystal may occur.

7. The method as claimed in claim 1, wherein:
in said step b), the crystal is made to grow in a pillar shape under the crystal growth condition such that crystal growth for a pillar-shape crystal may occur.

8. The method as claimed in claim 1, wherein:
in said step b), the crystal is made to grow in a plate shape under the crystal growth condition such that crystal growth for a plate-shape crystal may occur.

9. The method as claimed in claim 1, wherein:
the crystal growth is performed for a crystal of GaN where sodium (Na) is used as the alkaline metal; gallium (Ga) is used as the material at least comprising a group-III metal; and a nitrogen gas ($N_2$) is used as the material at least comprising nitrogen; and
the crystal growth condition is defined by the pressure of the nitrogen gas and the temperature of the mixed molten liquid of gallium and sodium.

10. The method as claimed in claim 9, wherein:
the crystal growth is performed from a seed crystal under the crystal growth condition defined by the following expression:

$$a1/T + b1 \leq \log P \leq a2/T + b2$$

where:
P denotes the effective pressure (Pa) of the nitrogen gas;
T denotes the absolute temperature (K) of the mixed molten liquid;
a1=−5.40×10$^{-3}$;
b1=4.83;
a2=−5.59×10$^{-3}$;
b2=5.47.

11. The method as claimed in claim 9, wherein:
the crystal growth is performed into a pillar-shaped crystal under the crystal growth condition defined by the following expression:

$$a2/T + b2 \leq \log P \leq a3/T + b3$$

where:
P denotes the effective pressure (Pa) of the nitrogen gas;
T denotes the absolute temperature (K) of the mixed molten liquid;
a2=−5.59×10$^{-3}$;
b2=5.47;
a3=−5.67×10$^{-3}$;
b3=5.83.

12. The method as claimed in claim 9, wherein:
the crystal growth is performed into a plate-shaped crystal under the crystal growth condition defined by the following expression:

$$a3/T + b3 \leq \log P$$

where:
P denotes the effective pressure (Pa) of the nitrogen gas;
T denotes the absolute temperature (K) of the mixed molten liquid;
a3=−5.67×10$^{-3}$;
b3=5.83.

13. The method as claimed in claim 1, wherein:
said step b) is performed in a reaction vessel; and
the atmosphere in said reaction vessel in said step b) comprises a mixed gas of the material at least comprising nitrogen and an inactive gas.

14. The method as claimed in claim 13, further comprising the step of:
d) controlling in said step b) the pressure of the material at least comprising nitrogen and the pressure of the inactive gas of the mixed gas in said reaction vessel independently from one another.

15. The method as claimed in claim 14, wherein:
said step d) comprises a step of supplying the mixed gas into said reaction vessel after preparing the mixed gas by mixing the material at least comprising nitrogen and the inactive gas at a beforehand controlled pressure ratio therebetween.

16. The method as claimed in claim 13, further comprising the step of d) continuously supplying the material at least comprising nitrogen during said step b).

17. The method as claimed in claim 13, wherein:
the material at least comprising nitrogen comprises a nitrogen gas.

18. The method as claimed in claim 13, wherein:
the inactive gas comprises an argon gas.

19. The method as claimed in claim 1, further comprising the step of:
d) maintaining the group-III nitride crystal on growth during said step b) around a gas-to-liquid interface between a gas of the material at least comprising nitrogen and the mixed molten liquid, or a gas-to-liquid interface between a nitrogen gas produced from decomposition of the material at least comprising nitrogen and the mixed molten liquid.

20. The method as claimed in claim 19, wherein:
said step d) comprises steps of d-1) holding a seed crystal of the group-III nitride in a manner such that a predetermined crystal plane thereof is made parallel to the gas-to-liquid interface so as to grow a plate-shaped group-III nitride crystal having the main surface parallel to the gas-to-liquid interface.

21. The method as claimed in claim 20, wherein:
the predetermined crystal plane of the seed crystal to be made parallel to the gas-to-liquid interface comprises (1-100) in-plane, or (11-20) a-plane, and, therefrom, the plate-shaped group-III nitride crystal having the m-plane or a-plane parallel to the gas-to-liquid interface is made to grow.

22. A group-III nitride crystal growth apparatus comprising:
a reaction vessel in which a mixed molten liquid of an alkaline metal and a material at least comprising a group-III metal is prepared; and a crystal growth condition setting unit for setting a crystal growth condition for growing a group-III nitride crystal of the group-III metal and nitrogen from the mixed molten liquid and a material at least comprising nitrogen, wherein said crystal growth condition setting unit sets the predetermined crystal growth condition according to a zone defined by a pressure and a temperature in the crystal growth process.

23. The apparatus as claimed in claim 22, wherein:

said crystal growth condition setting unit sets the predetermined crystal growth condition according to the zone from among a plurality of zones each defined by the pressure and temperature in the crystal growth process; and different modes of crystal growth may occur according to respective ones of the plurality of zones.

24. The apparatus as claimed in claim 23, wherein:

under the crystal growth condition according to a zone of the plurality of zones, the crystal grows from a seed crystal.

25. The method as claimed in claim 23, wherein:

the plurality of zones are defined by a curve expressed by the following expression:

$$\log P = a/T + b$$

where:
P denotes the effective pressure (Pa) of nitrogen in a reaction vessel in which the crystal growth occurs;
T denotes the absolute temperature (K) of the mixed molten liquid; and
a and b denote coefficients.

26. The apparatus as claimed in claim 25, wherein:

the curve expressed by the following formula:

$$\log P = a/T + b$$

is controllable according to a ratio in amount between the alkaline metal and group-III metal to be used in the crystal growth process.

27. The apparatus as claimed in claim 22, wherein:

in the crystal growth process, a crystal is made to grow from a seed crystal under the crystal growth condition such that crystal growth may occur from a seed crystal.

28. The apparatus as claimed in claim 22, wherein:

in the crystal growth, a crystal is made to grow in a pillar shape under the crystal growth condition such that crystal growth for a pillar-shape crystal may occur.

29. The apparatus as claimed in claim 22, wherein:

in the crystal growth, the crystal is made to grow in a plate shape under the crystal growth condition such that crystal growth for a plate-shape crystal may occur.

30. The apparatus as claimed in claim 22, wherein:

the crystal growth is performed for the crystal of GaN where sodium (Na) is used as the alkaline metal; gallium (Ga) is used as the material at least comprising a group-III metal; and a nitrogen gas ($N_2$) is used as the material at least comprising nitrogen; and the crystal growth condition is defined by the pressure of the nitrogen gas and the temperature of the mixed molten liquid of gallium and sodium.

31. The apparatus as claimed in claim 30, wherein:

the crystal growth is performed from a seed crystal under the crystal growth condition defined by the following expression:

$$a1/T + b1 \leq \log P \leq a2/T + b2$$

where:
P denotes the effective pressure (Pa) of the nitrogen gas;
T denotes the absolute temperature (K) of the mixed molten liquid;
$a1 = -5.40 \times 10^{-3}$;
$b1 = 4.83$;
$a2 = -5.59 \times 10^{-3}$;
$b2 = 5.47$.

32. The apparatus as claimed in claim 30, wherein:

the crystal growth is performed into a pillar-shaped crystal under the crystal growth condition defined by the following expression:

$$a2/T + b2 \leq \log P \leq a3/T + b3$$

where:
P denotes the effective pressure (Pa) of the nitrogen gas;
T denotes the absolute temperature (K) of the mixed molten liquid;
$a2 = -5.59 \times 10^{-3}$;
$b2 = 5.47$;
$a3 = -5.67 \times 10^{-3}$;
$b3 = 5.83$.

33. The apparatus as claimed in claim 30, wherein:

the crystal growth is performed into a plate-shaped crystal under the crystal growth condition defined by the following expression:

$$a3/T + b3 \leq \log P$$

where:
P denotes the effective pressure (Pa) of the nitrogen gas;
T denotes the absolute temperature (K) of the mixed molten liquid;
$a3 = -5.67 \times 10^{-3}$;
$b3 = 5.83$.

34. The apparatus as claimed in claim 22, further comprising:

an atmosphere setting unit setting the atmosphere in said reaction vessel so as to make it comprise a mixed gas of the material at least comprising nitrogen and an inactive gas.

35. The apparatus as claimed in claim 34, further comprising:

a unit controlling the pressure of the material at least comprising nitrogen and the pressure of the inactive gas of the mixed gas in said reaction vessel independently from one another.

36. The apparatus as claimed in claim 35, wherein:

said atmosphere setting unit comprises a unit supplying the mixed gas into said reaction vessel after preparing the mixed gas by mixing the material at least comprising nitrogen and the inactive gas at a beforehand controlled pressure ratio therebetween.

37. The apparatus as claimed in claim 34, further comprising a unit continuously supplying the material at least comprising nitrogen during the crystal growth process.

38. The apparatus as claimed in claim 34, wherein:

the material at least comprising nitrogen comprises a nitrogen gas.

39. The apparatus as claimed in claim 34, wherein:

the inactive gas comprises an argon gas.

40. The apparatus as claimed in claim 22, further comprising a crystal maintaining unit maintaining the group-III nitride crystal on growth around a gas-to-liquid interface between a gas of the material at least comprising nitrogen and the mixed molten liquid, or a gas-to-liquid interface between a nitrogen gas produced from decomposition of the material at least comprising nitrogen and the mixed molten liquid.

41. The apparatus as claimed in claim 40, wherein:

said crystal maintain unit comprises a mechanism maintaining the gas-to-liquid interface at a predetermined height during progress of the crystal growth.

42. The apparatus as claimed in claim 40, wherein:

said crystal maintaining unit comprises a mechanism maintaining the group-III nitride crystal on growth at the same height as that of the gas-to-liquid interface during progress of the crystal growth.

43. The apparatus as claimed in claim 42, wherein:

said mechanism comprises a mechanism for moving a jig holding the group-III nitride crystal on growth upward or downward.

44. The apparatus as claimed in claim 42, wherein:

said mechanism comprises a mechanism for causing a jig holding the crystal on growth to float on the mixed molten liquid.

45. The apparatus as claimed in claim 42, wherein:

said mechanism comprises a device setting a seed crystal of the group-III nitride.

46. The apparatus as claimed in claim 22, further comprising a heating unit inside of said reaction vessel for controlling the temperature therein so as to set it at a temperature such that the group-III nitride crystal may grow there.

47. The apparatus as claimed in claim 46, wherein:

said heating unit comprises a temperature control unit by which the temperature in said reaction vessel is controlled so that the group-III nitride crystal may grow there.

48. The apparatus as claimed in claim 46, wherein:

said heating unit comprises a plurality of heating devices each independently controllable in its heating function.

49. The apparatus as claimed in claim 48, wherein:

said plurality of heating devices comprises a first heating device controlling the temperature of the inside or the surface of the mixed molten liquid and a second heating device controlling the temperature above the surface of the mixed molten liquid.

50. The apparatus as claimed in claim 46, further comprising a heating element in said mixed molten liquid container holding the mixed molten liquid.

51. The apparatus as claimed in claim 22, further comprising an external vessel containing said reaction vessel, wherein:

the mixed molten liquid of the alkaline metal and the material at least comprising a group-III metal is prepared, and the group-III nitride crystal of the group-III metal and nitrogen is made to grow from said mixed molten liquid and the material at least comprising nitrogen in said reaction vessel; and a heating unit heating said reaction vessel such that the group-ill nitride crystal may grow in said reaction vessel is provided outside of said reaction vessel and inside of said external vessel.

52. The apparatus as claimed in claim 51, wherein:

a configuration is provided such that the atmosphere inside of said reaction vessel and the atmosphere outside of said reaction vessels and inside of said external vessel are controllable independently from one another.

53. The apparatus as claimed in claim 51, wherein:

a configuration is provided such that the alkaline metal steam occurring from the mixed molten liquid is prevented from escaping from said reaction vessel.

54. The apparatus as claimed in claim 51, wherein:

a configuration is provided such that a pressure difference between the pressure inside of the reaction vessel and the pressure outside of the same and inside of external vessel may be reduced.

55. The apparatus as claimed in claim 51, wherein:

said heating unit comprises a temperature control unit by which the temperature in said reaction vessel is controlled such that the group-III nitride crystal may grow therein.

56. The apparatus as claimed in claim 51, wherein:

said heating device comprises a plurality of heating devices each independently controllable in its heating function.

57. The apparatus as claimed in claim 56, wherein:

said plurality of heating devices comprises a first heating device controlling the temperature of the inside or the surface of the mixed molten liquid and a second heating device controlling the temperature above the surface of the mixed molten liquid.

58. A group-III nitride crystal yielded according to the method claimed in claim 1.

59. A group-III nitride crystal yielded according to the method claimed in claim 13.

60. A group-III nitride crystal yielded according to the method claimed in claim 19.

61. A semiconductor device employing the group-III nitride crystal claimed in claim 58.

62. A semiconductor device employing the group-III nitride crystal claimed in claim 59.

63. A semiconductor device employing the group-III nitride crystal claimed in claim 60.

64. The semiconductor device claimed in claim 61, forming an optical device.

65. The semiconductor device claimed in claim 62, forming an optical device.

66. The semiconductor device claimed in claim 63, forming an optical device.

67. The semiconductor device claimed in claim 61, forming an electronic device.

68. The semiconductor device claimed in claim 62, forming an electronic device.

69. The semiconductor device claimed in claim 63, forming an electronic device.

* * * * *